US012451152B1

(12) United States Patent
Saplakoglu et al.

(10) Patent No.: US 12,451,152 B1
(45) Date of Patent: Oct. 21, 2025

(54) SOUND SOURCE CLASSIFICATION AND BEAMFORMING

(71) Applicant: Amazon Technologies, Inc., Seattle, WA (US)

(72) Inventors: Gurhan Saplakoglu, Acton, MA (US); Berkant Tacer, Bellevue, WA (US); Alexander Kanaris, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 386 days.

(21) Appl. No.: 17/852,513

(22) Filed: Jun. 29, 2022

(51) Int. Cl.
*G10L 21/028* (2013.01)
*G10L 15/22* (2006.01)
*G10L 21/0216* (2013.01)
*H04R 3/00* (2006.01)

(52) U.S. Cl.
CPC .......... *G10L 21/0216* (2013.01); *G10L 15/22* (2013.01); *G10L 21/028* (2013.01); *H04R 3/005* (2013.01); *G10L 2021/02166* (2013.01)

(58) Field of Classification Search
CPC ... G10L 21/0216; G10L 15/22; G10L 21/028; G10L 2021/02166
See application file for complete search history.

(56) References Cited

U.S. PATENT DOCUMENTS

| | | | | |
|---|---|---|---|---|
| 10,127,922 | B2* | 11/2018 | Nakadai | G01S 3/8006 |
| 10,206,036 | B1* | 2/2019 | Feng | G06V 40/161 |
| 10,755,727 | B1* | 8/2020 | Chu | G10L 25/78 |
| 10,984,790 | B2* | 4/2021 | Lim | G01S 3/8055 |
| 11,762,052 | B1* | 9/2023 | Ganguly | G01S 5/20 |
| | | | | 367/124 |
| 2016/0372131 | A1* | 12/2016 | Niwa | G10L 21/0264 |
| 2019/0180014 | A1* | 6/2019 | Kovvali | G01S 3/80 |
| 2021/0166721 | A1* | 6/2021 | Takahashi | G10L 21/0208 |

OTHER PUBLICATIONS

T. May, et.al., "A Binaural Scene Analyzer for Joint Localization and Recognition of Speakers in the Presence of Interfering Noise Sources and Reverberation," in IEEE Transactions on Audio, Speech, and Language Processing, vol. 20, No. 7, pp. 2016-2030, Sep. 2012 (Year: 2012).*

* cited by examiner

*Primary Examiner* — Bhavesh M Mehta
*Assistant Examiner* — Nandini Subramani
(74) *Attorney, Agent, or Firm* — Pierce Atwood LLP

(57) ABSTRACT

A system configured to perform source classification using a continuously active beamformer and a classifier to improve beamforming. A device processes audio data representing sounds from multiple sound sources to determine a source direction corresponding to each detected sound source. For each audio frame, the classifier receives a source direction for each unknown sound source and uses the source direction to determine first spectral characteristics that are unique to the individual sound source. By comparing the first spectral characteristics to spectral characteristics associated with labeled sound sources, the device identifies a match and associates the source directions with a corresponding labeled sound source. For each labeled sound source, the classifier determines attributes of a corresponding signal, and the device uses these attributes to select a single sound source. Using a desired look direction associated with the selected sound source, the beamformer generates audio data representing desired speech.

22 Claims, 15 Drawing Sheets

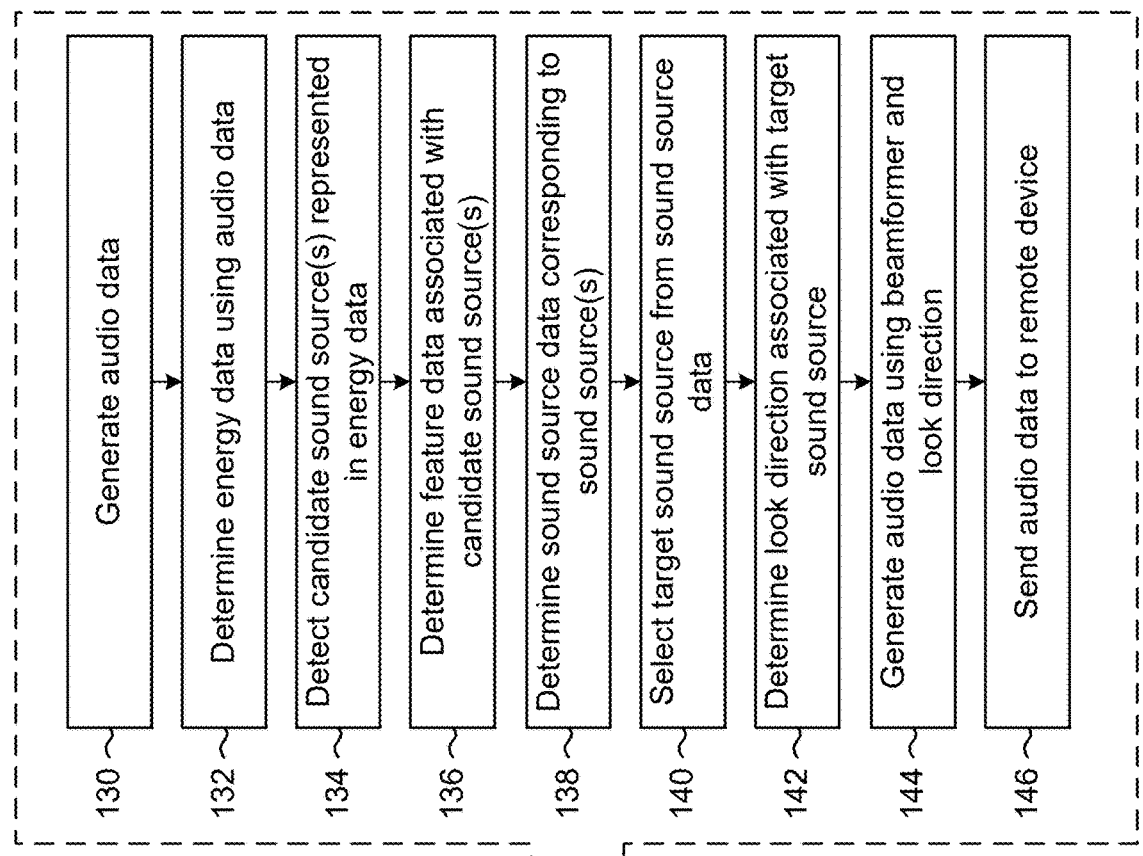
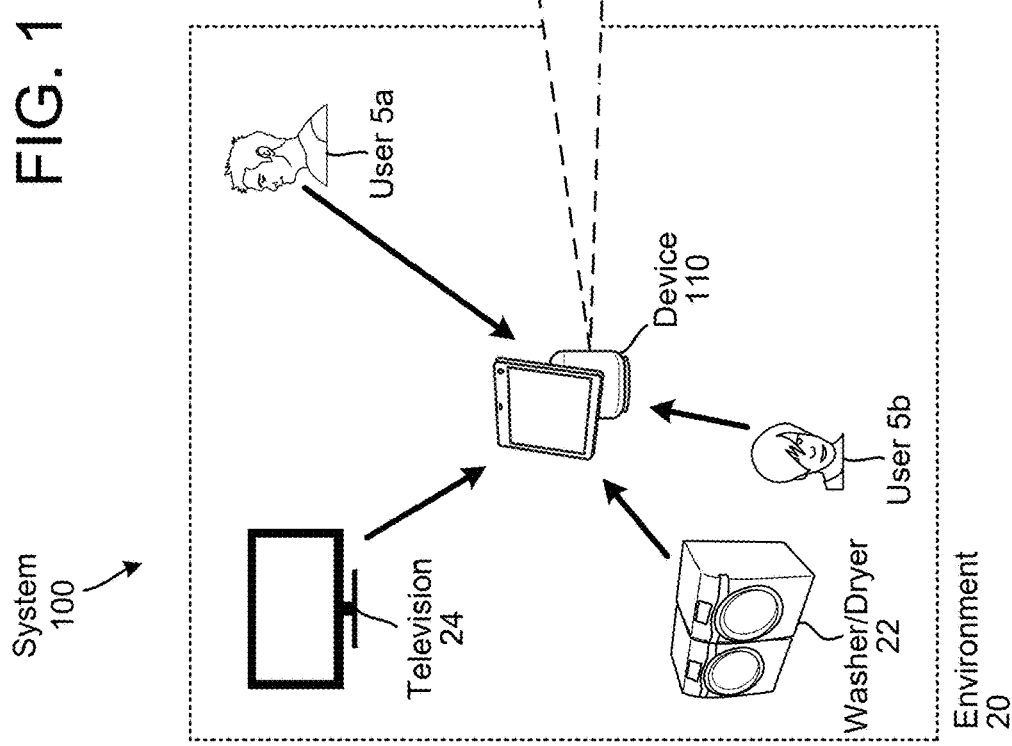
FIG. 1

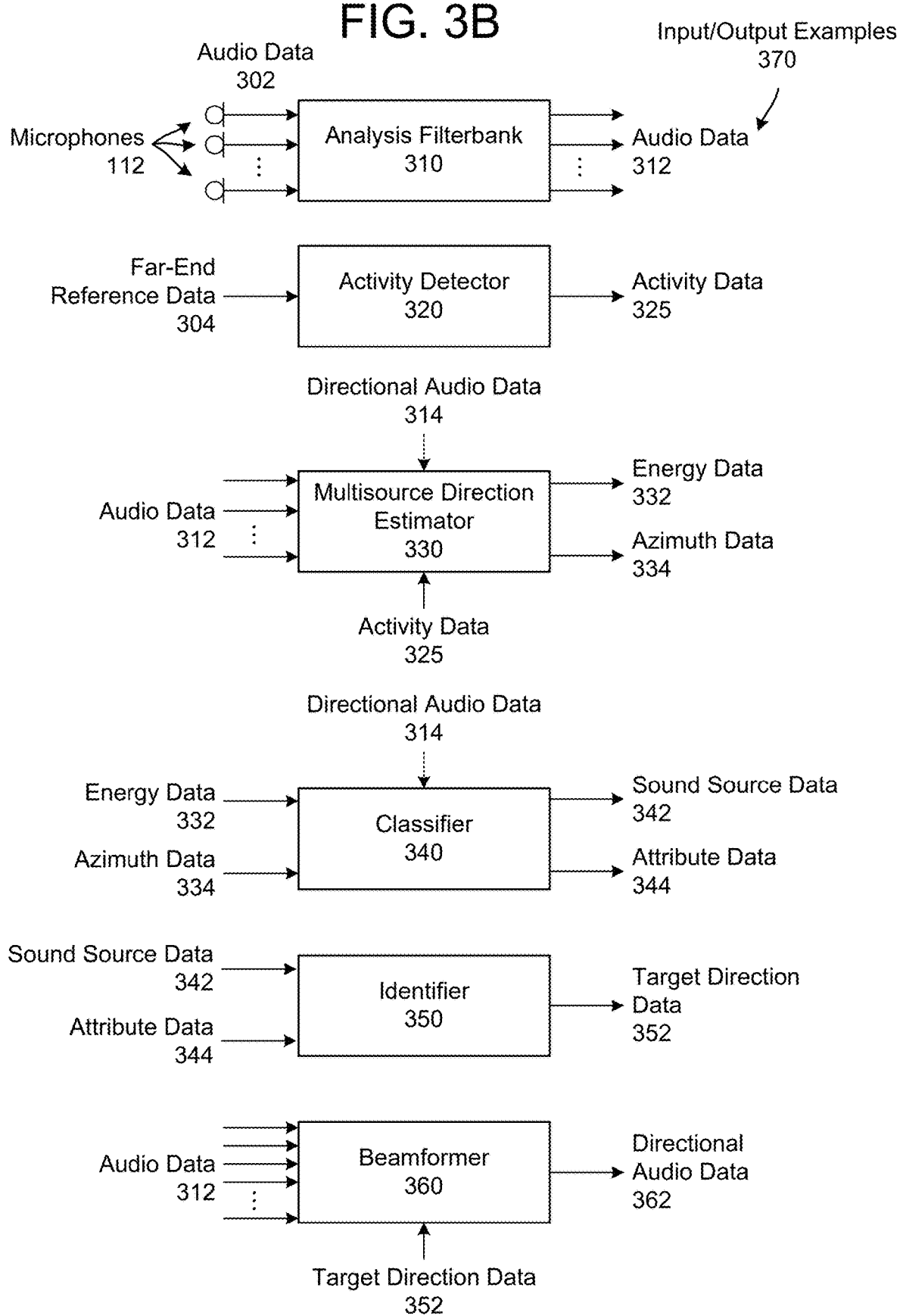

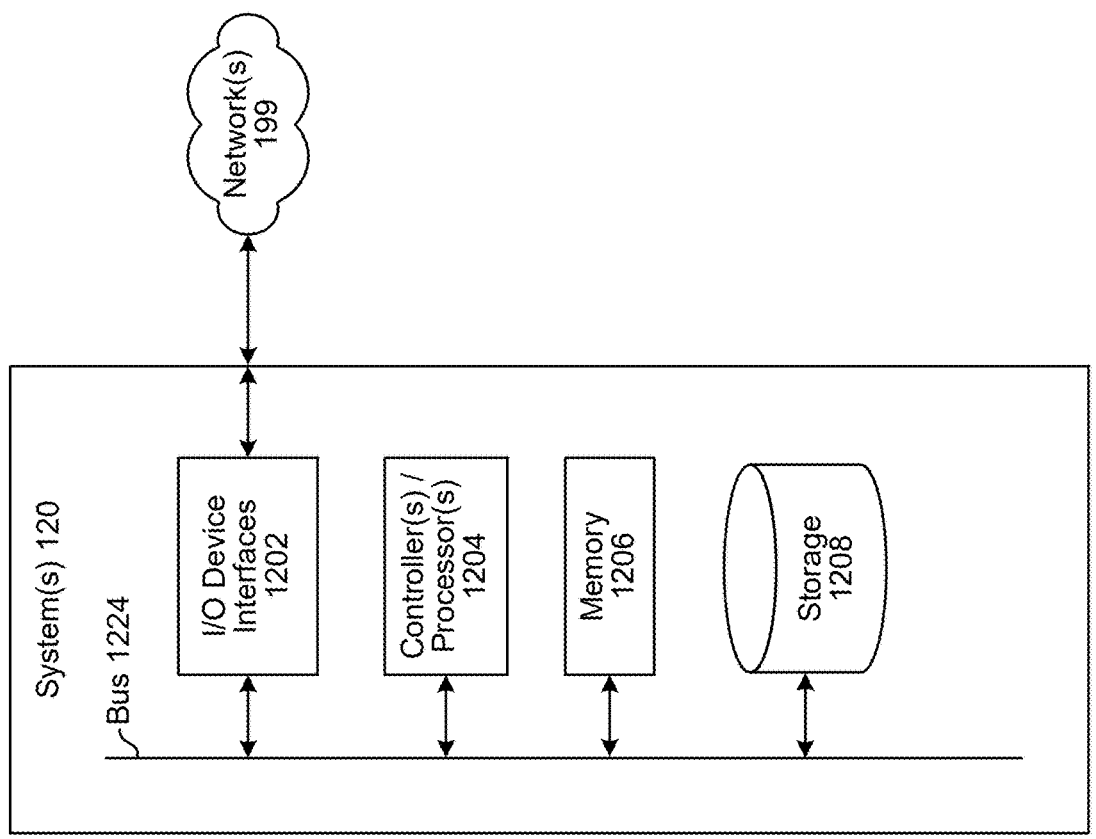

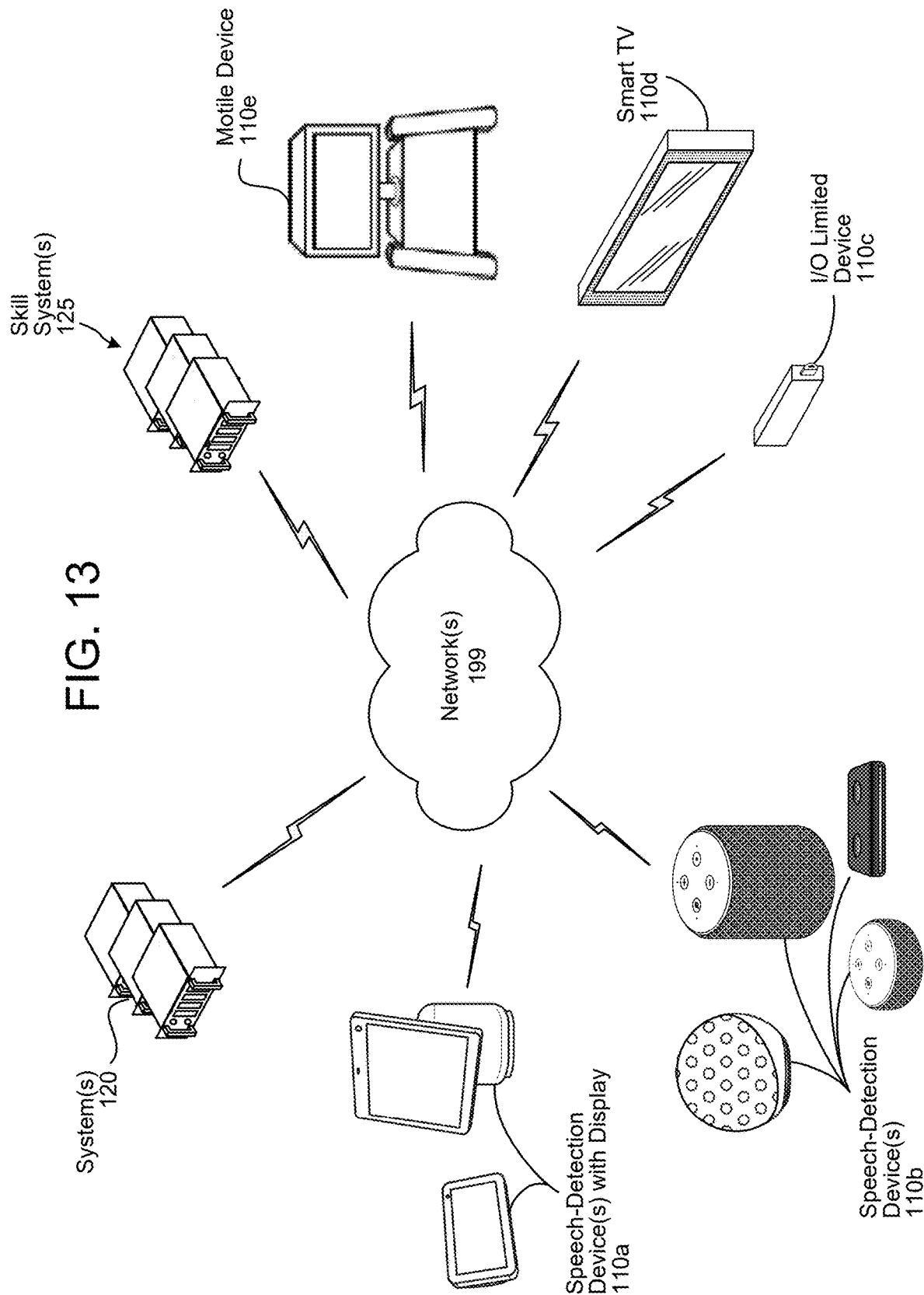

SOUND SOURCE CLASSIFICATION AND BEAMFORMING

BACKGROUND

With the advancement of technology, the use and popularity of electronic devices has increased considerably. Electronic devices are commonly used to capture and process audio data.

BRIEF DESCRIPTION OF DRAWINGS

For a more complete understanding of the present disclosure, reference is now made to the following description taken in conjunction with the accompanying drawings.

FIG. 1 illustrates a system configured to perform sound source classification and beamforming according to embodiments of the present disclosure.

FIGS. 3A-3B illustrate example component diagrams of a sound source classification system according to examples of the present disclosure.

FIG. 12 is a block diagram conceptually illustrating example components of a system, according to embodiments of the present disclosure.

FIG. 13 illustrates an example of a computer network for use with the overall system, according to embodiments of the present disclosure.

DETAILED DESCRIPTION

Figure 2A:
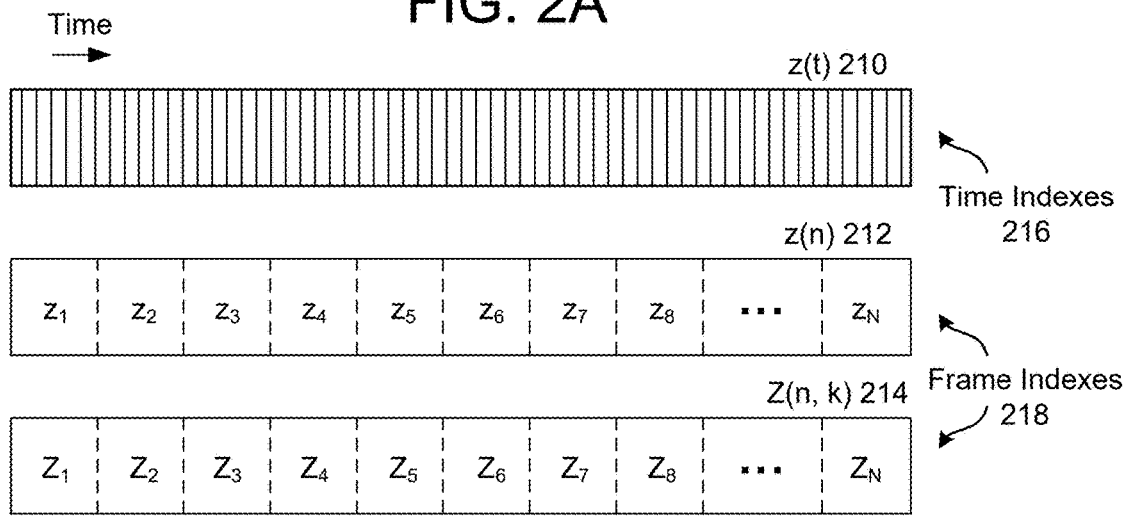
FIGS. 2A-2D illustrate examples of frame indexes, tone indexes, and channel indexes.

Electronic devices may be used to capture audio and process audio data. The audio data may be used for voice commands and/or sent to a remote device as part of a communication session. To improve output audio data and capture audio that only corresponds to a particular user, a device may attempt to isolate desired speech associated with the user from undesired speech associated with other users and/or other sources of noise, such as ambient noise in an environment around the device. For example, the device may perform sound source localization to distinguish between multiple sound sources represented in the audio data. However, while the sound source localization separates the audio data based on the sound source, the device cannot tell which sound source is associated with the desired speech.

To improve beamforming, devices, systems and methods are disclosed that perform sound source classification using a continuously active beamformer and a classifier. A device processes audio data representing sounds from multiple sound sources to determine a source direction corresponding to each detected sound source. For each audio frame, the classifier receives a source direction for each unknown sound source and uses the source direction to determine first characteristics that are unique to the individual sound source. By comparing the first characteristics to characteristics associated with known sound sources, the device identifies a match and associates the source directions with a corresponding sound source. For each sound source, the classifier determines attributes of a corresponding signal, and the device uses these attributes to select a target sound source. Using a desired look direction associated with the selected sound source, the beamformer generates audio data representing desired speech.

FIG. 1 illustrates a high-level conceptual block diagram of a system 100 configured to perform sound source classification and beamforming according to embodiments of the present disclosure. Although FIG. 1, and other figures/discussion illustrate the operation of the system in a particular order, the steps described may be performed in a different order (as well as certain steps removed or added) without departing from the intent of the disclosure. As illustrated in FIG. 1, the system 100 may include a device 110, which may be communicatively coupled to network(s) 199 and/or system(s) 120, although the disclosure is not limited thereto.

The device 110 may be an electronic device configured to capture and/or receive audio data. For example, the device 110 may include a microphone array configured to generate audio data, although the disclosure is not limited thereto and the device 110 may include multiple microphones without departing from the disclosure. As is known and used herein, "capturing" an audio signal and/or generating audio data includes a microphone transducing audio waves (e.g., sound waves) of captured sound to an electrical signal and a codec digitizing the signal to generate the microphone audio data. In addition to capturing the input audio data, the device 110 may be configured to receive output audio data and generate output audio using one or more loudspeakers of the device 110. For example, the device 110 may generate output audio corresponding to media content, such as music, a movie, and/or the like.

In some examples, a first user 5a of the device 110 may establish a communication session with another device, where digitized speech signals are compressed, packetized, and transmitted via the network(s) 199. One technique for establishing the communication session involves Voice over Internet Protocol (VoIP), although the disclosure is not limited thereto and the device 110 may use other techniques without departing from the disclosure. During a communication session, the device 110 may receive far-end reference signal(s) (e.g., playback audio data) from a remote device/remote server(s) via the network(s) 199 and may generate output audio (e.g., playback audio) based on the far-end reference signal(s) using the one or more loudspeaker(s).

Using one or more microphone(s) 112 associated with the device 110, the device 110 may capture input audio as microphone signals (e.g., near-end reference audio data, input audio data, microphone audio data, etc.), may perform audio processing to the microphone signals to generate an output signal (e.g., output audio data), and may send the output signal to the remote device/remote server(s) via the network(s) 199. For example, the device 110 may send the output signal to the remote device either directly or via a remote server(s) and may receive the far-end reference signal(s) from the remote device either directly or via the remote server(s).

However, the disclosure is not limited thereto and in some examples, the device 110 may send the output signal to the system(s) 120 in order for the system(s) 120 to determine a voice command. For example, during a communication session the device 110 may receive the far-end reference signal(s) from the remote device and may generate the output audio based on the far-end reference signal(s). However, the microphone signal may be separate from the communication session and may include a voice command directed to the system(s) 120. Therefore, the device 110 may send the output signal to the system(s) 120 (e.g., natural language command processing system) and the system(s) 120 may determine a voice command represented in the output signal and may perform an action corresponding to the voice command (e.g., execute a command, send an instruction to the device 110 and/or other devices to execute the command, etc.).

In some examples, the system(s) 120 may perform Automatic Speech Recognition (ASR) processing, Natural Language Understanding (NLU) processing and/or command processing to determine the voice command. The voice commands may control the device 110, audio devices (e.g., play music over loudspeaker(s), capture audio using microphone(s), or the like), multimedia devices (e.g., play videos using a display, such as a television, computer, tablet or the like), smart home devices (e.g., change temperature controls, turn on/off lights, lock/unlock doors, etc.), and/or the like without departing from the disclosure. However, the disclosure is not limited thereto, and in other examples the device 110 may be configured to perform natural language processing to determine the voice command and may perform an action corresponding to the voice command without departing from the disclosure.

As illustrated in FIG. 1, an environment 20 of the device 110 may include four separate sound sources, although the disclosure is not limited thereto. For example, FIG. 1 illustrates that the environment 20 may include a first user 5a at a first location (e.g., first direction relative to the device 110), a second user 5b at a second location (e.g., second direction relative to the device 110), a washer/dryer 22 (e.g., first noise source) at a third location (e.g., third direction relative to the device 110), and a television 24 (e.g., second noise source) at a fourth location (e.g., fourth direction relative to the device 110). At various times, each of the sound sources may generate audible noises that may be represented in the input audio data generated by the device 110.

During the communication session, the device 110 may generate an output signal representing desired speech. In the example illustrated in FIG. 1, the device 110 may generate the output signal by selecting between the first sound source (e.g., first user 5a) or the second sound source (e.g., second user 5b), but ignoring the third sound source (e.g., first noise source represented by the washer/dryer 22) and the fourth sound source (e.g., second noise source represented by the television 24).

To improve beamforming and select the desired speech while ignoring the noise sources, the device 110 may include a continuously active beamformer along with a classifier component and an identifier component. For example, the classifier component may process multi-channel audio data generated by the microphones 112 to detect multiple sound sources and classify the sound sources based on spectral characteristics unique to an individual sound source. Based on these classifications, the classifier component may generate attribute data representing characteristics of the sound sources and the identifier component may select a sound source that corresponds to desired speech. Thus, the device 110 may determine a look direction associated with the selected sound source and input the look direction to the beamformer component to generate audio data representing the desired speech.

As illustrated in FIG. 1, the device 110 may generate (130) audio data using the microphones 112 of the device 110, may determine (132) energy data using the audio data, and may detect (134) one or more candidate sound source(s) represented in the energy data. For example, the device 110 may determine the energy data representing acoustic energy in a plurality of directional beams surrounding the device 110, and individual peaks represented in the energy data may represent individual candidate sound sources. Thus, a first direction (e.g., azimuth value, angle information, etc.) associated with an individual peak represented in the energy data indicates that a first candidate sound source is detected in the first direction.

After determining the candidate sound source(s), the device 110 may determine (136) feature data associated with each of the candidate sound source(s) and may determine (138) sound source data corresponding to the candidate sound source(s) based on the feature data. For example, the device 110 may use the feature data to distinguish between the candidate sound source(s) and associate each candidate sound source with a unique sound source identifier and corresponding attribute data. In some examples, the sound source data may indicate a current direction associated with each of the sound source identifiers. However, the disclosure is not limited thereto, and in other examples the sound source data may indicate sound source locations over time and may include a plurality of azimuth values associated with each of the sound source identifiers.

In some examples, the device 110 may determine first feature data for a first candidate sound source using a portion of the audio data corresponding to a first direction of the first candidate sound source (e.g., first azimuth value). For example, the device 110 may use a beamformer to generate first beamformed audio data associated with the first direction and may extract the first feature data from the first beamformed audio data. In some examples, the device 110 may classify the candidate sound sources by comparing the feature data associated with the candidate sound sources to attribute data associated with the sound source identifiers. For example, the device 110 may determine a first subband profile (e.g., spectral characteristics) associated with the first candidate sound source and may match the first subband profile to one of several group subband profiles, such as a first group subband profile that is associated with a first sound source identifier. As a subband profile is unique to each sound source, the device 110 may identify matching subband profiles for each candidate sound source and associate the candidate sound source with a corresponding sound source identifier based on the matching subband profiles. Thus, the device 110 may store an association between a sound source identifier, a direction (e.g., azimuth value) associated with the sound source identifier, and sound source data associated with the sound source.

The device 110 may select (140) a target sound source from the sound source data, may determine (142) a look direction associated with the target sound source, may generate (144) audio data using the beamformer component and the look direction, and may send (146) the audio data to a remote device as part of the communication session, as described in greater detail below with regard to FIGS. 3A-3B. In some examples, the device 110 may determine attribute data indicating attributes and/or characteristics associated with each of the sound source identifiers and may select the target sound source based on the attribute data. For example, the device 110 may select the first sound source identifier as the target sound source because first attributes associated with the first sound source identifier may correspond to speech, whereas attributes associated with other sound source identifiers (e.g., third sound source and fourth sound source) correspond to stationary noise sources, although the disclosure is not limited thereto. If the device 110 determines that a first sound source identifier associated with the first sound source (e.g., first user 5a) and a second sound source identifier associated with the second sound source (e.g., second user 5b) correspond to talkers, in some examples the device 110 may select between the two users based on a signal to noise ratio (SNR) value and/or the like, although the disclosure is not limited thereto.

An audio signal is a representation of sound and an electronic representation of an audio signal may be referred to as audio data, which may be analog and/or digital without departing from the disclosure. For ease of illustration, the disclosure may refer to either audio data (e.g., microphone audio data, input audio data, etc.) or audio signals (e.g., microphone audio signal, input audio signal, etc.) without departing from the disclosure. Additionally or alternatively, portions of a signal may be referenced as a portion of the signal or as a separate signal and/or portions of audio data may be referenced as a portion of the audio data or as separate audio data. For example, a first audio signal may correspond to a first period of time (e.g., 30 seconds) and a portion of the first audio signal corresponding to a second period of time (e.g., 1 second) may be referred to as a first portion of the first audio signal or as a second audio signal without departing from the disclosure. Similarly, first audio data may correspond to the first period of time (e.g., 30 seconds) and a portion of the first audio data corresponding to the second period of time (e.g., 1 second) may be referred to as a first portion of the first audio data or second audio data without departing from the disclosure. Audio signals and audio data may be used interchangeably, as well; a first audio signal may correspond to the first period of time (e.g., 30 seconds) and a portion of the first audio signal corresponding to a second period of time (e.g., 1 second) may be referred to as first audio data without departing from the disclosure.

In some examples, the audio data may correspond to audio signals in a time-domain. However, the disclosure is not limited thereto and the device 110 may convert these signals to a subband-domain or a frequency-domain prior to performing additional processing, such as adaptive feedback reduction (AFR) processing, acoustic echo cancellation (AEC), adaptive interference cancellation (AIC), noise reduction (NR) processing, tap detection, and/or the like. For example, the device 110 may convert the time-domain signal to the subband-domain by applying a bandpass filter or other filtering to select a portion of the time-domain signal within a desired frequency range. Additionally or alternatively, the device 110 may convert the time-domain signal to the frequency-domain using a Fast Fourier Transform (FFT) and/or the like.

As used herein, audio signals or audio data (e.g., microphone audio data, or the like) may correspond to a specific range of frequency bands. For example, the audio data may correspond to a human hearing range (e.g., 20 Hz-20 kHz), although the disclosure is not limited thereto.

As used herein, a frequency band (e.g., frequency bin) corresponds to a frequency range having a starting frequency and an ending frequency. Thus, the total frequency range may be divided into a fixed number (e.g., 256, 512, etc.) of frequency ranges, with each frequency range referred to as a frequency band and corresponding to a uniform size. However, the disclosure is not limited thereto and the size of the frequency band may vary without departing from the disclosure.

FIGS. 2A-2D illustrate examples of frame indexes, tone indexes, and channel indexes. As described above, the device 110 may generate microphone audio data z(t) using microphone(s). For example, a first microphone may generate first microphone audio data z1(t) in the time-domain, a second microphone may generate second microphone audio data z2(t) in the time-domain, and so on. As illustrated in FIG. 2A, a time-domain signal may be represented as microphone audio data z(t) 210, which is comprised of a sequence of individual samples of audio data. Thus, z(t) denotes an individual sample that is associated with a time t.

While the microphone audio data z(t) 210 is comprised of a plurality of samples, in some examples the device 110 may group a plurality of samples and process them together. As illustrated in FIG. 2A, the device 110 may group a number of samples together in a frame to generate microphone audio data z(n) 212. As used herein, a variable z(n) corresponds to the time-domain signal and identifies an individual frame (e.g., fixed number of samples s) associated with a frame index n.

In some examples, the device 110 may convert microphone audio data z(t) 210 from the time-domain to the subband-domain. For example, the device 110 may use a plurality of bandpass filters to generate microphone audio data z(t, k) in the subband-domain, with an individual bandpass filter centered on a narrow frequency range. Thus, a first bandpass filter may output a first portion of the microphone audio data z(t) 210 as a first time-domain signal associated with a first subband (e.g., first frequency range), a second bandpass filter may output a second portion of the microphone audio data z(t) 210 as a time-domain signal associated with a second subband (e.g., second frequency range), and so on, such that the microphone audio data z(t, k) comprises a plurality of individual subband signals (e.g., subbands). As used herein, a variable z(t, k) corresponds to the subband-domain signal and identifies an individual sample associated with a particular time t and tone index k.

For ease of illustration, the previous description illustrates an example of converting microphone audio data z(t) 210 in the time-domain to microphone audio data z(t, k) in the subband-domain. However, the disclosure is not limited thereto, and the device 110 may convert microphone audio data z(n) 212 in the time-domain to microphone audio data z(n, k) the subband-domain without departing from the disclosure.

Additionally or alternatively, the device 110 may convert microphone audio data z(n) 212 from the time-domain to a frequency-domain. For example, the device 110 may perform Discrete Fourier Transforms (DFTs) (e.g., Fast Fourier transforms (FFTs), short-time Fourier Transforms (STFTs), and/or the like) to generate microphone audio data $Z(n, k)$ 214 in the frequency-domain. As used herein, a variable $Z(n, k)$ corresponds to the frequency-domain signal and identifies an individual frame associated with frame index n and tone index k. As illustrated in FIG. 2A, the microphone audio data $z(t)$ 212 corresponds to time indexes 216, whereas the microphone audio data $z(n)$ 212 and the microphone audio data $Z(n, k)$ 214 corresponds to frame indexes 218.

A Fast Fourier Transform (FFT) is a Fourier-related transform used to determine the sinusoidal frequency and phase content of a signal, and performing FFT produces a one-dimensional vector of complex numbers. This vector can be used to calculate a two-dimensional matrix of frequency magnitude versus frequency. In some examples, the system 100 may perform FFT on individual frames of audio data and generate a one-dimensional and/or a two-dimensional matrix corresponding to the microphone audio data $Z(n)$. However, the disclosure is not limited thereto and the system 100 may instead perform short-time Fourier transform (STFT) operations without departing from the disclosure. A short-time Fourier transform is a Fourier-related transform used to determine the sinusoidal frequency and phase content of local sections of a signal as it changes over time.

Using a Fourier transform, a sound wave such as music or human speech can be broken down into its component "tones" of different frequencies, each tone represented by a sine wave of a different amplitude and phase. Whereas a time-domain sound wave (e.g., a sinusoid) would ordinarily be represented by the amplitude of the wave over time, a frequency-domain representation of that same waveform comprises a plurality of discrete amplitude values, where each amplitude value is for a different tone or "bin." So, for example, if the sound wave consisted solely of a pure sinusoidal 1 kHz tone, then the frequency-domain representation would consist of a discrete amplitude spike in the bin containing 1 kHz, with the other bins at zero. In other words, each tone "k" is a frequency index (e.g., frequency bin).

FIG. 2A illustrates an example of time indexes 216 (e.g., microphone audio data $z(t)$ 210) and frame indexes 218 (e.g., microphone audio data $z(n)$ 212 in the time-domain and microphone audio data $Z(n, k)$ 216 in the frequency-domain). For example, the system 100 may apply FFT processing to the time-domain microphone audio data $z(n)$ 212, producing the frequency-domain microphone audio data $Z(n, k)$ 214, where the tone index "k" (e.g., frequency index) ranges from 0 to K and "n" is a frame index ranging from 0 to N. As illustrated in FIG. 2A, the history of the values across iterations is provided by the frame index "n", which ranges from 1 to N and represents a series of samples over time.

Figure 2B:
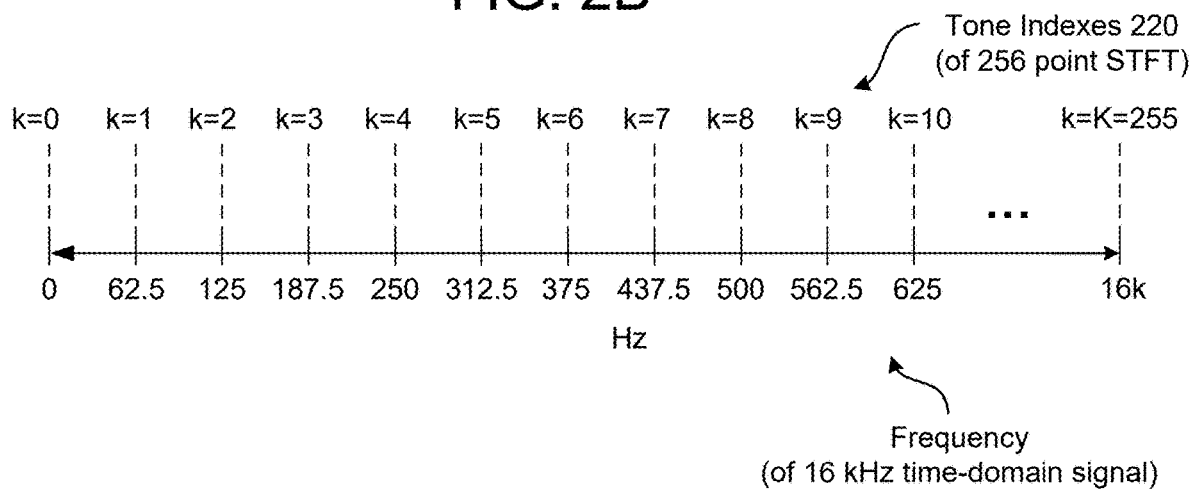

FIG. 2B illustrates an example of performing a K-point FFT on a time-domain signal. As illustrated in FIG. 2B, if a 256-point FFT is performed on a 16 kHz time-domain signal, the output is 256 complex numbers, where each complex number corresponds to a value at a frequency in increments of 16 kHz/256, such that there is 125 Hz between points, with point 0 corresponding to 0 Hz and point 255 corresponding to 16 kHz. As illustrated in FIG. 2B, each tone index 220 in the 256-point FFT corresponds to a frequency range (e.g., subband) in the 16 kHz time-domain signal. While FIG. 2B illustrates the frequency range being divided into 256 different frequency ranges (e.g., tone indexes), the disclosure is not limited thereto and the system 100 may divide the frequency range into K different frequency ranges (e.g., K indicates an FFT size). While FIG. 2B illustrates the tone index 220 being generated using a Fast Fourier Transform (FFT), the disclosure is not limited thereto. Instead, the tone index 220 may be generated using Short-Time Fourier Transform (STFT), generalized Discrete Fourier Transform (DFT) and/or other transforms known to one of skill in the art (e.g., discrete cosine transform, non-uniform filter bank, etc.).

Figure 2C:
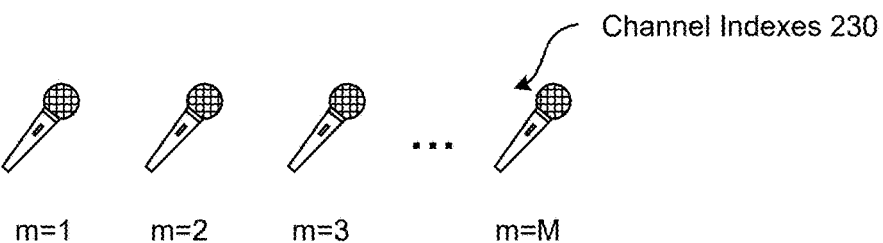

The system 100 may include multiple microphones, with a first channel m corresponding to a first microphone (e.g., m=1), a second channel (m+1) corresponding to a second microphone (e.g., m=2), and so on until a final channel (M) that corresponds to final microphone (e.g., m=M). FIG. 2C illustrates channel indexes 230 including a plurality of channels from channel m=1 to channel m=M. While an individual device 110 may include multiple microphones, during a communication session the device 110 may select a single microphone and generate microphone audio data using the single microphone. However, while many drawings illustrate a single channel (e.g., one microphone), the disclosure is not limited thereto and the number of channels may vary. For the purposes of discussion, an example of system 100 may include "M" microphones (M≥1) for hands free near-end/far-end distant speech recognition applications.

While FIGS. 2A-2D are described with reference to the microphone audio data $z(t)$, the disclosure is not limited thereto and the same techniques apply to the playback audio data $x(t)$ (e.g., reference audio data) without departing from the disclosure. Thus, playback audio data $x(t)$ indicates a specific time index t from a series of samples in the time-domain, playback audio data $x(n)$ indicates a specific frame index n from series of frames in the time-domain, and playback audio data $X(n, k)$ indicates a specific frame index n and frequency index k from a series of frames in the frequency-domain.

Prior to converting the microphone audio data $z(n)$ and the playback audio data $x(n)$ to the frequency-domain, the device 110 may first perform time-alignment to align the playback audio data $x(n)$ with the microphone audio data $z(n)$. For example, due to nonlinearities and variable delays associated with sending the playback audio data $x(n)$ to loudspeaker(s) using a wired and/or wireless connection, the playback audio data $x(n)$ may not be synchronized with the microphone audio data $z(n)$. This lack of synchronization may be due to a propagation delay (e.g., fixed time delay) between the playback audio data $x(n)$ and the microphone audio data $z(n)$, clock jitter and/or clock skew (e.g., difference in sampling frequencies between the device 110 and the loudspeaker(s)), dropped packets (e.g., missing samples), and/or other variable delays.

To perform the time alignment, the device 110 may adjust the playback audio data $x(n)$ to match the microphone audio data $z(n)$. For example, the device 110 may adjust an offset between the playback audio data $x(n)$ and the microphone audio data $z(n)$ (e.g., adjust for propagation delay), may add/subtract samples and/or frames from the playback audio data $x(n)$ (e.g., adjust for drift), and/or the like. In some examples, the device 110 may modify both the microphone audio data $z(n)$ and the playback audio data $x(n)$ in order to synchronize the microphone audio data $z(n)$ and the playback audio data $x(n)$. However, performing nonlinear modifications to the microphone audio data $z(n)$ results in first microphone audio data $z1(n)$ associated with a first microphone to no longer be synchronized with second microphone audio data $z2(n)$ associated with a second microphone. Thus, the device 110 may instead modify only the playback audio data x(n) so that the playback audio data x(n) is synchronized with the first microphone audio data z1(n).

While FIG. 2A illustrates the frame indexes 218 as a series of distinct audio frames, the disclosure is not limited thereto. In some examples, the device 110 may process overlapping audio frames and/or perform calculations using overlapping time windows without departing from the disclosure. For example, a first audio frame may overlap a second audio frame by a certain amount (e.g., 80%), such that variations between subsequent audio frames are reduced. Additionally or alternatively, the first audio frame and the second audio frame may be distinct without overlapping, but the device 110 may determine power value calculations using overlapping audio frames. For example, a first power value calculation associated with the first audio frame may be calculated using a first portion of audio data (e.g., first audio frame and n previous audio frames) corresponding to a fixed time window, while a second power calculation associated with the second audio frame may be calculated using a second portion of the audio data (e.g., second audio frame, first audio frame, and n−1 previous audio frames) corresponding to the fixed time window. Thus, subsequent power calculations include n overlapping audio frames.

Figure 2D:
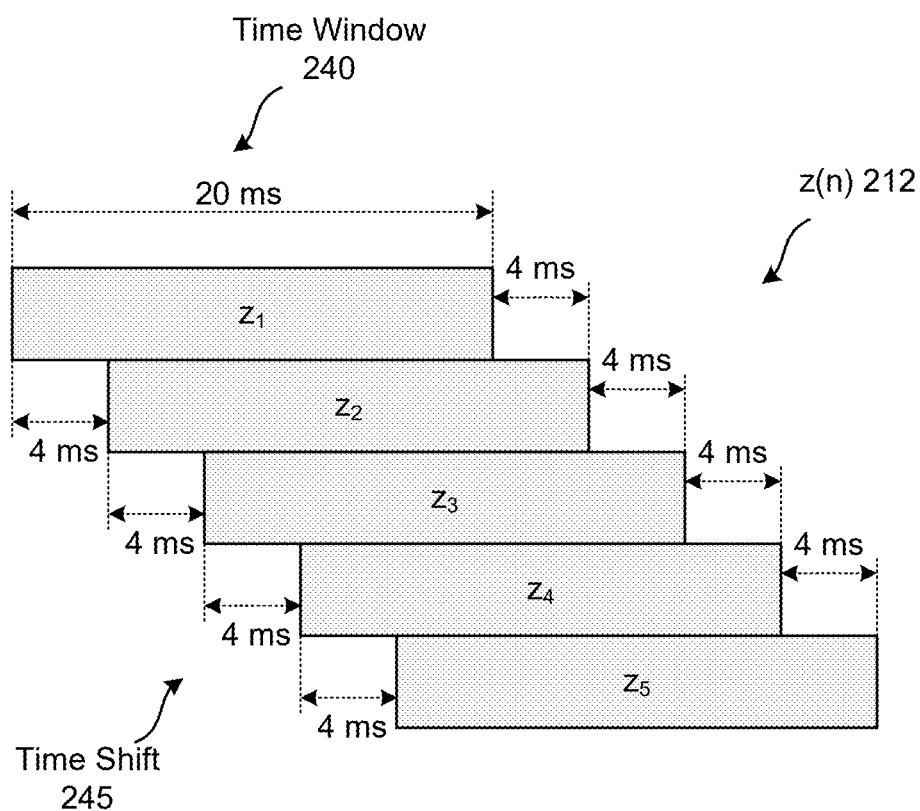

As illustrated in FIG. 2D, overlapping audio frames may be represented as overlapping audio data associated with a time window 240 (e.g., 20 ms) and a time shift 245 (e.g., 4 ms) between neighboring audio frames. For example, a first audio frame x1 may extend from 0 ms to 20 ms, a second audio frame x2 may extend from 4 ms to 24 ms, a third audio frame x3 may extend from 8 ms to 28 ms, and so on. Thus, the audio frames overlap by 80%, although the disclosure is not limited thereto and the time window 240 and the time shift 245 may vary without departing from the disclosure.

As described above, the device 110 may be configured to conduct a communication session with a remote device. For example, the device 110 may establish a communication session with another device, where digitized speech signals are compressed, packetized, and transmitted via the network(s) 199 (e.g., VoIP communication session). During the communication session, the device 110 may receive far-end reference signal(s) originating from the remote device and may generate output audio (e.g., playback audio) based on the far-end reference signal(s) using the one or more loudspeaker(s). In addition, the device 110 may capture input audio as microphone signals, may perform audio processing to the microphone signals to generate an output signal, and may send the output signal to the remote device via the network(s) 199. In some examples, the output signal may be a single-channel output, although the disclosure is not limited thereto.

Figure 3A:
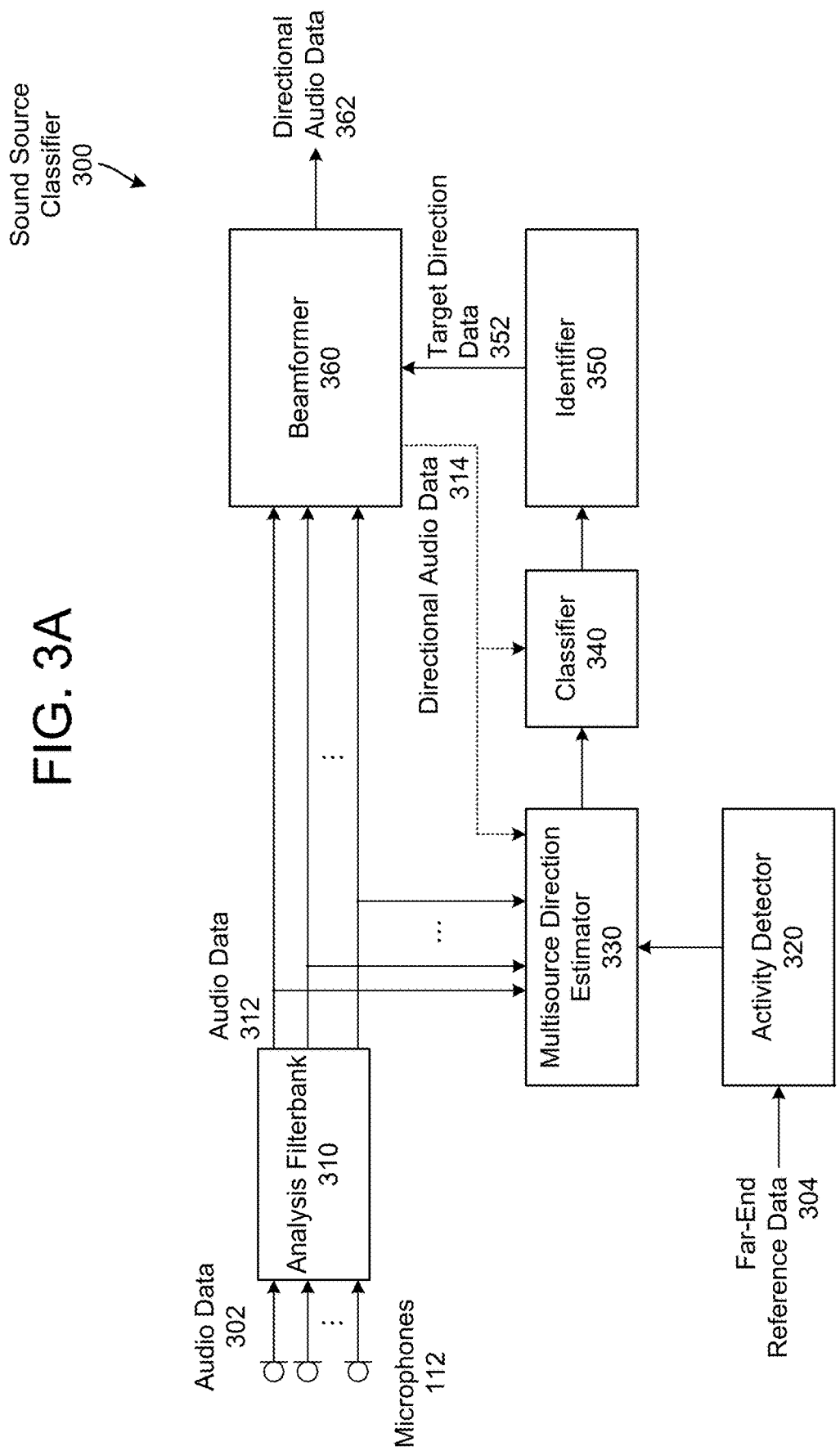

FIGS. 3A-3B illustrate example component diagrams of a sound source classification system according to examples of the present disclosure. As illustrated in FIG. 3A, the device 110 may generate the output signal using a sound source classifier 300, which may include an analysis filterbank component 310, an activity detector component 320, a multisource direction estimator component 330, a classifier component 340, an identifier component 350, and a beamformer component 360. As will be described in greater detail below, the classifier component 340 and the identifier component 350 may select a target direction based on the sound source classification and the beamformer component 360 may generate the output signal using the selected target direction (e.g., look direction).

As illustrated in FIG. 3A, the device 110 may generate audio data 302 using a plurality of microphones 112, such that the audio data 302 may correspond to multiple channels. For example, if the device 110 includes eight individual microphones 112, the audio data 302 may include eight individual channels, although the disclosure is not limited thereto. The analysis filterbank component 310 may receive the audio data 302 in a time domain and may convert from the time domain to a frequency domain to generate audio data 312. For example, the analysis filterbank component 310 may generate the audio data 312 having a plurality of subbands (e.g., frequency ranges) associated with each channel. In some examples, the device 110 may include a separate analysis filterbank for each channel or individual microphone, although the disclosure is not limited thereto. Thus, the analysis filterbank component 310 may include a plurality of analysis filterbanks and/or the device 110 may include a plurality of analysis filterbank components 310 without departing from the disclosure. However, the disclosure is not limited thereto and in some examples the sound source classifier 300 may process the audio data 302 in the time domain without departing from the disclosure.

To generate the output signal, the sound source classifier 300 may process the multi-channel audio data 312 to generate a single channel output. For example, the sound source classifier 300 may process the audio data 312 using the beamformer component 360 to generate directional audio data 362 in order to isolate a speech signal represented in the audio data 302. However, in order to isolate the desired speech signal, the device 110 must identify a look direction associated with the desired speech signal. In the sound source classifier 300 illustrated in FIG. 3A, the device 110 may determine the look direction using the classifier component 340 and the identifier component 350 and the identifier component 350 may output the look direction to the beamformer component 360.

As illustrated in FIG. 3A, the audio data 312 may be input to a multisource direction estimator component 330. The multisource direction estimator component 330 may process the multi-channel audio data 312 to form a configurable number of beams and may determine an acoustic energy of each beam within a desired frequency range (e.g., specified subbands). The acoustic energy of each beam may be represented as energy data 332, which may indicate an energy value for each azimuth (e.g., angle or direction) relative to the device 110.

While FIG. 3A illustrates an example in which the multisource direction estimator component 330 receives the audio data 312 and processes the audio data 312 to form a configurable number of beams, the disclosure is not limited thereto. Instead, in some examples the beamformer component 360 may receive the audio data 312 and generate the configurable number of beams without departing from the disclosure. For example, the beamformer component 360 may generate directional audio data 314 corresponding to a fixed number of different beams (e.g., 36 different beams, although the disclosure is not limited thereto) and may send the directional audio data 314 to the multisource direction estimator component 330 and/or the classifier component 340 without departing from the disclosure. Thus, instead of receiving the audio data 312, the multisource direction estimator component 330 may only receive the directional audio data 314 without departing from the disclosure. The disclosure is not limited thereto, however, and the multisource direction estimator component 330 may receive both the audio data 312 and the directional audio data 314 without departing from the disclosure.

In some examples, the beamformer component 360 may generate the directional audio data 314 for a first number of beams (e.g., 36 beams) and may send the directional audio data 314 for each of the first number of beams to the multisource direction estimator component 330. In contrast, the beamformer component 360 may only send a portion of the directional audio data to the classifier component 340, such as the directional audio data 314 corresponding to a second number of beams associated with the azimuth data 334. However, the disclosure is not limited thereto, and in other examples the beamformer component 360 may send the directional audio data 314 for each of the first number of beams to the classifier component 340 without departing from the disclosure. Additionally or alternatively, in some examples the multisource direction estimator component 330 may send the portion of the directional audio data 314 to the classifier component 340 without departing from the disclosure.

In some examples, the multisource direction estimator component 330 may be configured to select a "best beam" as a look direction for the beamformer component 360. Thus, the multisource direction estimator component 330 may select a single beam, indicating a direction that corresponds to a strongest signal for a particular time range. For example, the multisource direction estimator component 330 may identify a strongest signal quality metric (e.g., signal-to-noise ratio (SNR) value, energy value, etc.) of sound sources represented in the audio data 312 and determine a direction associated with the strongest signal quality metric. However, in some examples the strongest signal quality metric may not correspond to desired speech (e.g., a talker) and may instead correspond to a loud noise source, such as a vacuum cleaner or other mechanical noise.

To ensure that the sound source classifier 300 selects the desired speech even when a loud noise source is present, the multisource direction estimator component 330 may detect sound sources and identify an azimuth value (e.g., relative direction) for each of the sound source(s) represented in the energy data 332. To illustrate an example, the multisource direction estimator component 330 may detect a first sound source (e.g., first portion of the audio data 312 corresponding to a first direction relative to the device 110), a second sound source (e.g., second portion of the audio data 312 corresponding to a second direction relative to the device 110), and so on. The azimuth values may be represented as azimuth data 334, which may include one or more azimuth values depending on the number of sound sources detected in a particular audio frame. For example, a first audio frame may include two azimuth values indicating that two sound sources are detected, whereas a second audio frame may include three azimuth values indicating that three sound sources are detected.

In some examples, the multisource direction estimator component 330 may detect the sound sources based on peaks represented in the energy data 332. For example, the multisource direction estimator component 330 may use a robust recursive algorithm to identify unique peaks represented in the energy data 332, although the disclosure is not limited thereto. The multisource direction estimator component 330 may detect a unique peak based on configuration parameters (e.g., design preferences), such as a minimum peak-to-average ratio, a maximum peak width, and/or the like. For example, the multisource direction estimator component 330 may detect a first peak and may include the first peak in the azimuth data 334 (e.g., consider the first peak to be valid) when a peak-to-average ratio associated with the first peak exceeds the minimum peak-to-average ratio and a peak width associated with the first peak is below the maximum peak width, although the disclosure is not limited thereto. A maximum number of peaks that the robust recursive algorithm can detect, along with a maximum number of iterations it can perform, are additional design parameters chosen associated with the multisource direction estimator component 330.

Figure 4:
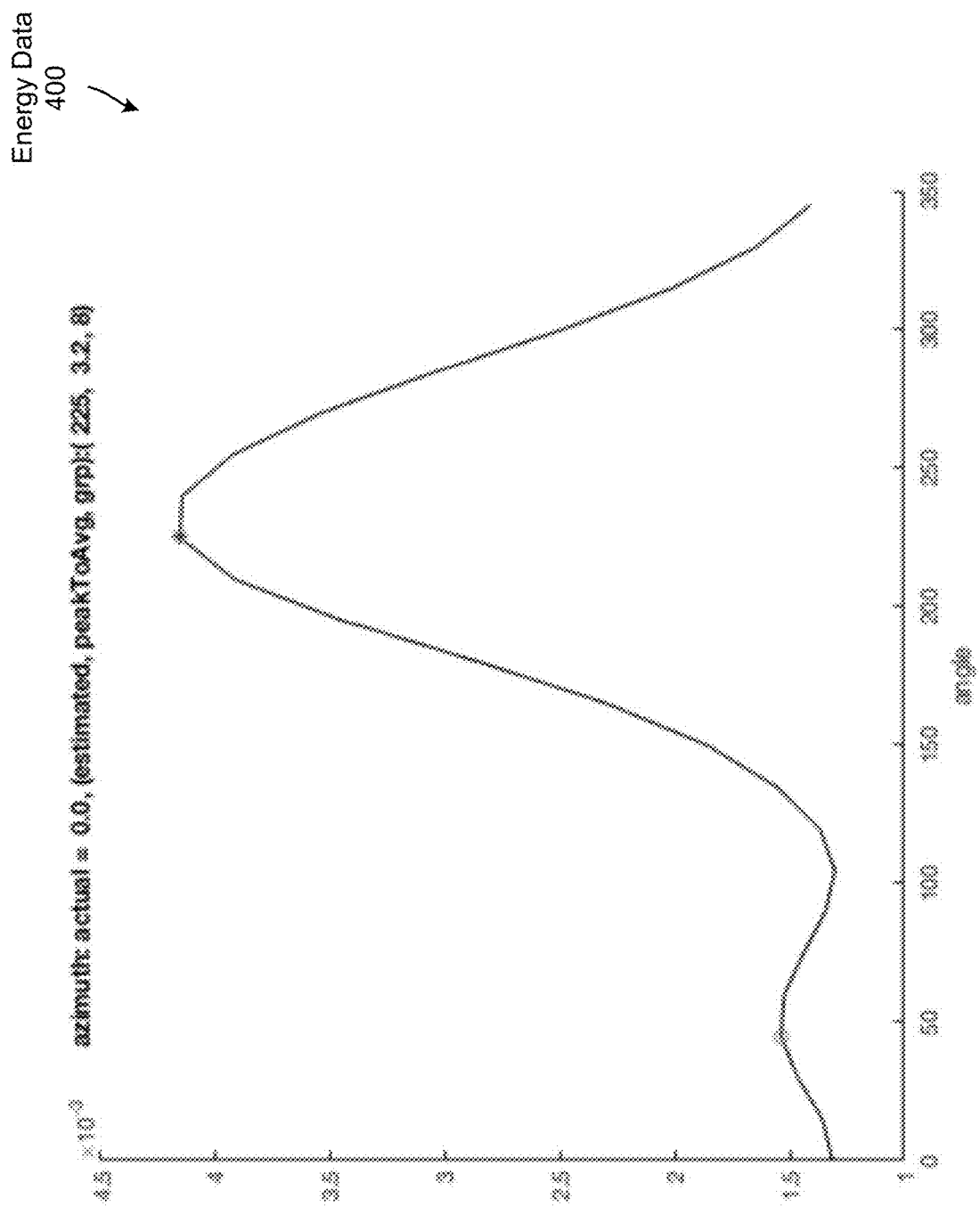
FIG. 4 illustrates an example of directional energy data according to examples of the present disclosure.

FIG. 4 illustrates an example of directional energy data according to examples of the present disclosure. As illustrated in FIG. 4, energy data 400 may include energy values for each azimuth (e.g., angle) corresponding to 360 degrees around the device 110, with a peak indicating a sound source at that particular azimuth value or angle. For example, the energy data 400 illustrated in FIG. 4 includes two peaks, which correspond to two sound sources detected at roughly 45 degrees and 210 degrees. Based on the example illustrated in FIG. 4, the multisource direction estimator component 330 may output energy data 332 corresponding to the energy data 400, along with azimuth data 334 indicating a first azimuth (e.g., 45 degrees) and a second azimuth (e.g., 210 degrees).

While the examples described above refer to the device 110 determining an azimuth value associated with each peak or candidate sound source, the disclosure is not limited thereto. Instead, the device 110 may determine an azimuth value and an elevation value without departing from the disclosure. Thus, the device 110 may determine a three-dimensional (3D) direction associated with the candidate sound source and may use the elevation value to distinguish between the candidate sound sources and/or to perform classification and associate the candidate sound source with a sound source identifier. For ease of illustration, the following description will continue to refer to the azimuth value, but any reference to the azimuth value or a direction associated with the candidate sound source may include both azimuth and elevation without departing from the disclosure.

Referring back to FIGS. 3A-3B, the multisource direction estimator component 330 may also receive activity data 325 from the activity detector component 320. In some examples, the activity detector component 320 may process far-end reference data 304 originating from the remote device and may determine when activity is detected. If activity is detected (e.g., far-end reference signal includes speech or other audible sounds), the activity detector component 320 may generate activity data 325 indicating that the activity is detected. For example, the activity data 325 may correspond to a binary output, with a first binary value (e.g., 0) indicating that no activity is detected and a second binary value (e.g., 1) indicating that activity is detected, although the disclosure is not limited thereto. In some examples, the activity detector component 320 may correspond to a voice activity detector (VAD), although the disclosure is not limited thereto and the activity detector component 320 may detect activity using other techniques without departing from the disclosure.

To avoid confusion caused by reflections of the playback audio generated using the far-end reference data 304, the multisource direction estimator component 330 may freeze processing when the activity data 325 indicates that activity is detected. For example, when the activity data 325 indicates that activity is detected, the multisource direction estimator component 330 may freeze the direction estimation process and the look direction may remain at its last estimated position. Thus, the multisource direction estimator component 330 may only generate the energy data 332 and/or the azimuth data 334 when the activity data 325 indicates that no activity is detected in the far-end reference data 304. While activity such as speech may frequently be detected during a communication session, the disclosure is not limited thereto and in some examples the multisource direction estimator component 330 may freeze processing when activity (e.g., speech) is detected while playing media content and/or the like without departing from the disclosure.

While the examples described above refer to the multisource direction estimator component 330 freezing processing when the activity data 325 indicates that activity is detected, the disclosure is not limited thereto. In some examples, instead of freezing the processing, the multisource direction estimator component 330 may be configured to change the processing when the activity is detected without departing from the disclosure. For example, the multisource direction estimator component 330 may modify weight values and/or other parameters when the activity is detected, although the disclosure is not limited thereto.

The classifier component 340 may be configured to group and track each sound source. For example, the classifier component 340 may be configured to track a sound source over time, collecting information about the sound source and maintaining a position of the sound source relative to the device 110. Thus, the classifier component 340 may enable the device 110 to track the sound source even as the device 110 and/or the sound source move relative to each other. In some examples, the classifier component 340 may determine a unique identification indicating an individual sound source, along with information about a position of the sound source relative to the device 110, a location of the sound source using a coordinate system or the like, an audio type associated with the sound source, additional information about the sound source (e.g., user identification, type of sound source, etc.), and/or the like, although the disclosure is not limited thereto.

As illustrated in FIG. 3B, the classifier component 340 may receive the energy data 332, the azimuth data 334, and/or directional audio data 314 associated with candidate sound sources. For example, the classifier component 340 may receive directional audio data 314 for each of the azimuth values indicated in the azimuth data 334 without departing from the disclosure. The classifier component 340 may classify and track the movement of all of the candidate sound sources and may generate sound source data 342 and/or attribute data 344. For example, for each audio frame the classifier component 340 may receive azimuth data 334 that includes one or more azimuth values corresponding to one or more candidate sound sources (e.g., detected sounds of unknown origin). Using the directional audio data 314 associated with these azimuth values, the classifier component 340 may associate the azimuth values with sound source identifiers and generate the sound source data 342. In some examples, the sound source data 342 may indicate the sound source identifiers, a current direction associated with each of the sound source identifiers, and/or previous locations associated with each of the sound source identifiers, although the disclosure is not limited thereto.

The classifier component 340 may classify an azimuth value by determining feature data using the directional audio data 314 associated with the azimuth value, matching the feature data to attribute data associated with one of the sound source identifiers, and associating the azimuth value with the sound source identifier. For example, if the classifier component 340 determines that first feature data associated with a first azimuth value is similar to attribute data associated with a first sound source identifier, the classifier component 340 may associate the first azimuth value with the first sound source identifier and generate sound source data 342 that associates the first azimuth value with the first sound source identifier. Thus, as part of classifying the azimuth values, the classifier component 340 may generate feature data corresponding to the azimuth values. In addition, the classifier component 340 may analyze the sound source data 342 and/or the directional audio data 314 corresponding to the azimuth values to determine the attribute data 344, which indicates features or attributes associated with the sound source over time.

In some examples, the classifier component 340 may classify a first azimuth value by determining features using the directional audio data 314 associated with the first azimuth value. For example, the classifier component 340 may determine a first subband profile (e.g., spectral characteristics) associated with the first azimuth value and may match the first subband profile to one of several group subband profiles corresponding to the sound source identifiers (e.g., known sound sources). To illustrate an example, a first group subband profile may indicate first spectral characteristics associated with a first group of azimuth values for a first sound source identifier, a second group subband profile may indicate second spectral characteristics associated with a second group of azimuth values for a second sound source identifier, and so on, for each of the sound source identifiers.

In some examples, the classifier component 340 may determine the first subband profile by calculating a subband averaging factor associated with the first azimuth value, although the disclosure is not limited thereto. As a subband profile (e.g., spectral characteristics) for a given sound source is relatively consistent over time, the classifier component 340 may determine the group subband profile most similar to the first subband profile and associate the first azimuth value with a sound source identifier corresponding to the selected group subband profile. For example, the classifier component 340 may determine that the first subband profile is similar to the second group subband profile and may associate the first azimuth value with the second sound source identifier. The classifier component 340 may then determine a subband profile associated with each additional azimuth value included in the azimuth data 334 and may classify the subband profiles similarly.

After classifying the azimuth data 334 as described above, the classifier component 340 may generate sound source data 342 indicating sound source identifiers and corresponding azimuth values. For example, the sound source data 342 may indicate that the second sound source identifier corresponds to the first azimuth value, that a first sound source identifier corresponds to a second azimuth value, and so on for each of the sound source identifiers. Thus, the sound source data 342 indicates the detected sound sources and corresponding directions, enabling the identifier component 350 to select a single target sound source with which to steer the beamformer component 360.

In addition to the sound source data 342, the classifier component 340 may generate attribute data 344, as illustrated in FIG. 3B. In some examples, the classifier component 340 may generate the attribute data 344 for a sound source identifier using the directional audio data 314 associated with the sound source identifier. For example, in addition to associating an azimuth value with a particular sound source identifier, the classifier component 340 may also associate feature data generated using the azimuth value with the sound source identifier. Additionally or alternatively, after associating the azimuth value with the sound source identifier, the classifier component 340 may determine additional features, attributes, and/or characteristics using the directional audio data 314 and may include these in the attribute data 344 without departing from the disclosure. Thus, the attribute data 344 may include some of the features used to classify the candidate sound sources (e.g., the subband profile and/or the like), although the disclosure is not limited thereto. However, as the sound source data 342 includes azimuth values associated with a sound source identifier over time, the attribute data 344 may also include additional features or characteristics that correspond to a longer duration of time without departing from the disclosure. Additionally or alternatively, the attribute data 344 may include attributes or characteristics derived from one or more features without departing from the disclosure.

To illustrate an example using the second sound source, the classifier component 340 may determine a first group of azimuth values associated with the second sound source identifier and may generate a portion of the attribute data 344 based on the first group of azimuth values. For example, the attribute data 344 may include an average subband profile and a subband profile variance associated with the first group, although the disclosure is not limited thereto. In addition, the attribute data 344 may include a spatial variance, a minimum activity level, a maximum activity level, other information associated with temporal intermittence, a maximum number of continuous active detections, and/or the like. Additionally or alternatively, the attribute data 344 may include secondary information determined using other features, such as a peak-to-average ratio, a range or variance associated with the peak represented in the energy data 332, a first indication indicating whether the second sound source is stationary or has a dynamic location, a second indication indicating whether the second sound source is a potential noise source, and/or the like.

As used herein, a spatial variance is a metric that indicates a difference between a current azimuth value and past azimuth value(s) or between a current beam and past beam (s). For example, a possible talker should have a spatial variance that exceeds a threshold value, indicating that the spatial location associated with the talker at least varies slightly over time. The minimum activity level and the maximum activity level are indicators of temporal intermittence (e.g., pauses) of a source. For example, a possible talker is expected to pause and not be continuously active, unlike a noise source (e.g., mechanical sound source) that continuously generates audible sounds. At the same time, a possible talker is also expected to be continuously active for at least a duration of time in order to generate speech (e.g., minimum activity level exceeds a duration threshold), unlike a transient noise source that is active for a very short period of time that isn't long enough to generate an utterance. A maximum number of continuous active detections is a similar metric used to distinguish a possible talker from a potential noise source. For example, if the maximum number of continuous active detections exceeds a threshold value, the device 110 may consider the sound source to be a stationary noise source.

The peak-to-average ratio may indicate a relative strength of the sound source (e.g., prominence of the peak relative to the average value) and in some examples the device 110 may use the peak-to-average ratio to select between two sound sources that both correspond to speech. The range or variance associated with the peak may indicate a range of azimuth values (e.g., between a lower azimuth value and an upper azimuth value) associated with the sound source, instead of a single azimuth value. The first indication may indicate that a sound source is stationary, such as when the spatial variance is below a threshold value, or that the sound source has a dynamic location, such as when the spatial variance is above the threshold value and/or varies over time. However, the disclosure is not limited thereto and the device 110 may determine the first indication using other features without departing from the disclosure. Finally, the second indication may determine that the second sound source is a potential noise source, such as when the maximum activity level exceeds a threshold value, the maximum number of continuous active detections exceeds a threshold value, and/or the like.

While the above description illustrates some examples of the attribute data 344, the disclosure is not limited thereto and the attribute data 344 may include additional information associated with the sound source identifiers without departing from the disclosure. Additionally or alternatively, while the above description refers to the classifier component 340 generating the attribute data 344, the disclosure is not limited thereto and in some examples the identifier component 350 may generate a portion of the attribute data 344 without departing from the disclosure. For example, the identifier component 350 may determine the secondary information (e.g., peak-to-average ratio, range or variance associated with the azimuth values, first indication, second indication, and/or the like) based on characteristics represented in the attribute data 344 without departing from the disclosure.

As illustrated in FIG. 3B, the classifier component 340 may output the sound source data 342 and/or the attribute data 344 to the identifier component 350 and the identifier component 350 may generate target direction data 352 for the beamformer component 360. For example, the identifier component 350 may be configured to determine an active talker from a group of sound sources included in the sound source data 342.

In some examples, the identifier component 350 may process the sound source data 342 to determine currently detected sound sources and corresponding azimuth values, and then may process the attribute data 344 to distinguish between the currently detected sound sources. As described above, the identifier component 350 may use the attribute data 344 to determine that some of the sound sources correspond to potential noise sources. For example, the identifier component 350 may determine that a sound source identifier associated with a minimum spatial variance below a threshold value may correspond to a potential noise source, that a sound source identifier associated with a maximum activity level above a threshold value or a minimum activity level below a threshold value may correspond to a potential noise source, that a sound source identifier associated with a maximum number of continuous active detections above a threshold value may correspond to a potential noise source, and/or the like.

Additionally or alternatively, the identifier component 350 may use the attribute data 344 to determine that some of the sound source identifiers correspond to possible talkers (e.g., users generating speech). For example, the identifier component 350 may determine that a sound source identifier associated with a minimum spatial variance above a threshold value may correspond to a possible talker, that a sound source identifier associated with a minimum activity level above a first threshold value and a maximum activity level below a second threshold value may correspond to a possible talker, that a sound source identifier associated with a maximum number of continuous active detections below a threshold value may correspond to a possible talker, and/or the like.

Regardless of how the identifier component 350 distinguishes between the multiple sound source identifiers included in the sound source data 342, the identifier component 350 may select a single sound source identifier as the talker and determine a look direction corresponding to the selected sound source identifier. For example, the identifier component 350 may select the second sound source identifier as the desired speech and may generate the target direction data 352 indicating a first direction associated with the second sound source identifier (e.g., first azimuth value). As described above, the beamformer component 360 may receive the target direction data 352 and may generate directional audio data 362 corresponding to the first direction.

In some examples, the classifier component 340 and/or the identifier component 350 may include a machine learning model, such as a deep neural network (DNN) or the like, without departing from the disclosure. For example, the classifier component 340 may be configured to process the energy data 332, the azimuth data 334, the directional audio data 314, features associated with the directional audio data 314, and/or additional data using the machine learning model to generate the sound source data 342 and/or the attribute data 344 corresponding to the sound sources without departing from the disclosure. Similarly, in some examples the identifier component 350 may be configured to process the sound source data 342 and/or the attribute data 344 to generate the target direction data 352 without departing from the disclosure. Additionally or alternatively, in some examples the classifier component 340 and the identifier component 350 may correspond to a single component that may include a machine learning model. For example, the device 110 may be configured to process the energy data 332, the azimuth data 334, the directional audio data 314, features associated with the directional audio data 314, and/or additional data using the machine learning model to generate the target direction data 352 without departing from the disclosure.

Figure 5:
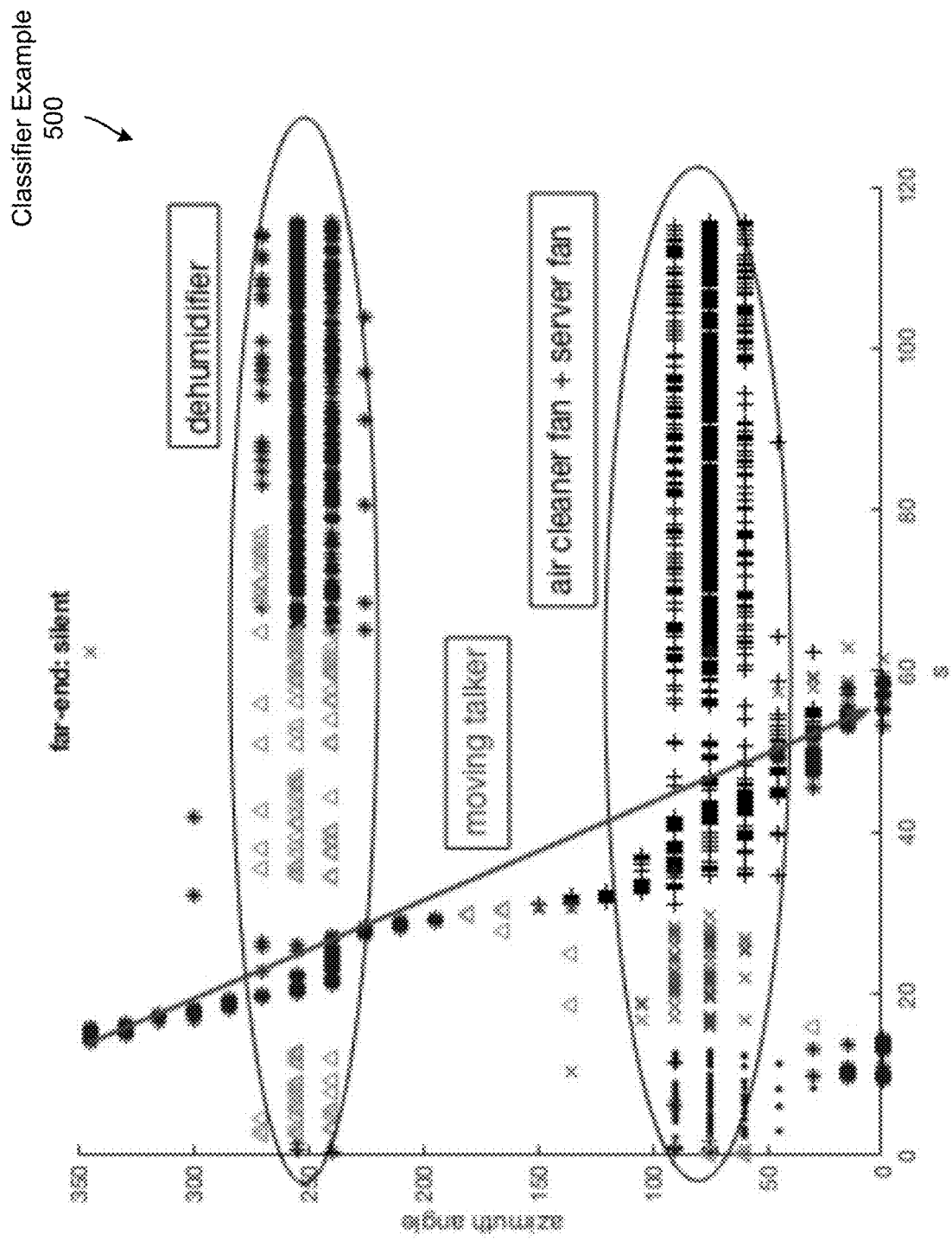
FIG. 5 illustrates an example of performing sound source classification according to examples of the present disclosure.

FIG. 5 illustrates an example of performing sound source classification according to examples of the present disclosure. As described in greater detail above, the classifier component 340 may receive azimuth data 334 from the multisource direction estimator component 330 over time. For example, the azimuth data 334 includes azimuth values corresponding to candidate sound sources detected by the multisource direction estimator component 330. For each audio frame, the classifier component 340 may receive azimuth data 334 indicating two or three azimuth values corresponding to candidate sound sources that are not yet associated with a sound source identifier, and the classifier component 340 may associate the azimuth values with a particular sound source identifier based on features associated with the azimuth values (e.g., spectral characteristics and/or other features derived from the directional audio data 314). Thus, the classifier component 340 may identify a sound source identifier for each of the azimuth values and associate the azimuth values with the sound source data corresponding to the sound source identifier.

As shown in FIG. 5, a classifier example 500 illustrates a plurality of azimuth values over a period of time (e.g., 120 seconds), with the plurality of azimuth values associated with sound source data corresponding to a total of four separate candidate sound sources. However, while the classifier example 500 identifies four separate candidate sound sources, the sound source data associated with a particular sound source may vary over time and the environment only includes three different sound sources. For example, the classifier example 500 indicates a first stationary noise source located in a first direction (e.g., 250 degrees), a second stationary noise source located in a second direction (e.g., 75 degrees), and a dynamic sound source (e.g., moving talker) that moves relative to the device 110.

While a first sound source (e.g., dehumidifier) corresponds to two different candidate sound source identifiers over time (e.g., Δ and *), and the actual azimuth values vary within a first range (e.g., 225 degrees to 275 degrees), it is clear that these azimuth values correspond to a first stationary noise source. Similarly, while a second sound source (e.g., mechanical fans) corresponds to three different candidate sound source identifiers over time (e.g., *, x, and +), and the actual azimuth values vary within a second range (e.g., 50 degrees to 90 degrees), it is clear that these azimuth values correspond to a second stationary noise source that is distinct from the first stationary noise source. While the second stationary noise source encompasses two separate noise sources (e.g., air cleaner fan and a server fan), the device 110 may group multiple noise sources as a single stationary noise source without departing from the disclosure.

In addition to the two stationary noise sources, the classifier example 500 includes a third sound source having a dynamic location (e.g., moving talker). For example, the dynamic sound source begins at a first location corresponding to a first azimuth value (e.g., 50 degrees), crosses in front of the device 110 at a second location (e.g., azimuth value wraps around from 0 degrees to 360 degrees), and then continues walking back to the first location. As illustrated in FIG. 5, the path of the dynamic sound source is tracked throughout the room, with the dynamic sound source represented as a distinct sound source identifier except when the moving talker walks in front of the second stationary noise source. While the classifier example 500 illustrates that the dynamic sound source is overwhelmed by the second stationary noise source and therefore azimuth values associated with the dynamic sound source may be grouped with sound source data associated with the second stationary noise source (e.g., the device 110 cannot distinguish between the dynamic sound source and the second stationary noise source), the device 110 may be configured to predict the location of the dynamic sound source based on the previous azimuth values associated with the dynamic sound source. For example, the device 110 may be able to predict that the dynamic sound source is within the second range even when the dynamic sound source is not identified as a separate candidate sound source (e.g., does not correspond to a peak in the energy data 332).

In the classifier example 500 illustrated in FIG. 5, a far-end reference is silent, resulting in a large number of azimuth values being classified by the classifier component 340. However, the far-end reference is not always silent during a communication session, which reduces a number of azimuth values being output to the classifier component 340. For example, as described in greater detail above with regard to FIG. 3A, the multisource direction estimator component 330 may freeze source direction estimation when the far-end reference data 304 is active. Thus, if the far-end reference data 304 is consistently active during the communication session, the multisource direction estimator component 330 will freeze the source direction estimation frequently, resulting in a small number of azimuth values represented in the sound source data.

Figure 6:
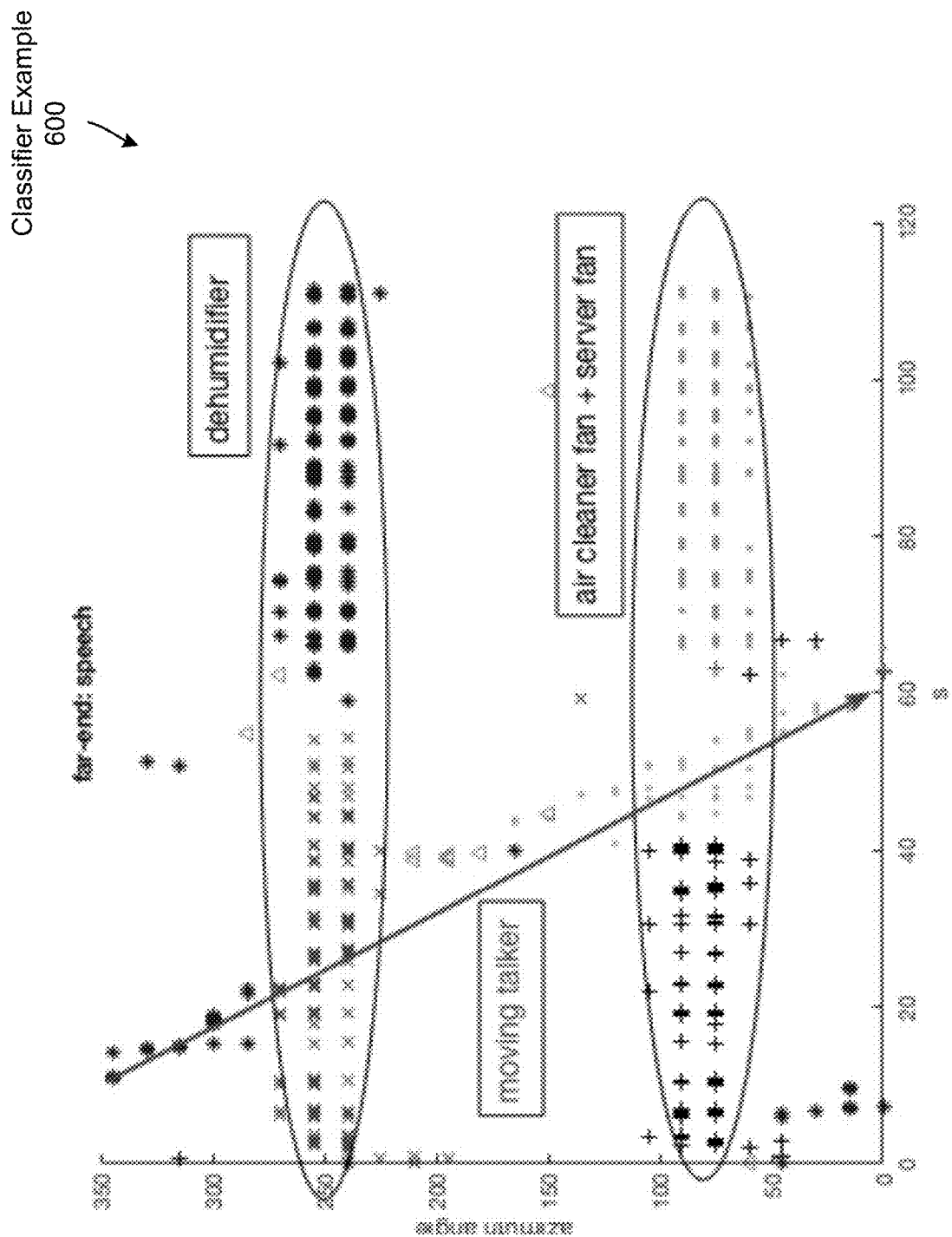
FIG. 6 illustrates an example of performing sound source localization when far-end voice activity is detected according to examples of the present disclosure.

FIG. 6 illustrates an example of performing sound source localization when far-end voice activity is detected according to examples of the present disclosure. As shown in FIG.

6, a classifier example 600 corresponds to the same environment illustrated in the classifier example 500, with two stationary noise sources and a dynamic sound source, except that the far-end reference is active and contains speech. Thus, the number of azimuth values output to the classifier component 340 during the classifier example 600 is reduced relative to the classifier example 500 illustrated in FIG. 5.

As shown in FIG. 6, the classifier example 600 illustrates a plurality of azimuth values over a period of time (e.g., 120 seconds), with the plurality of azimuth values associated with a total of six different sound source identifiers. However, while the classifier example 600 identifies six different sound source identifiers, the sound source identifier associated with a particular sound source may vary over time and the classifier example 600 only represents three unique sound sources at one time. For example, the classifier example 600 indicates a first stationary noise source located in a first direction (e.g., 250 degrees), a second stationary noise source located in a second direction (e.g., 75 degrees), and a dynamic sound source (e.g., moving talker) that moves relative to the device 110.

While a first sound source (e.g., dehumidifier) corresponds to two different sound source identifiers (e.g., x and *), and the actual azimuth values vary within a first range (e.g., 225 degrees to 275 degrees), it is clear that these azimuth values correspond to a first stationary noise source. Similarly, while a second sound source (e.g., mechanical fans) corresponds to two different candidate sound identifiers (e.g., + and ·), and the actual azimuth values vary within a second range (e.g., 50 degrees to 100 degrees), it is clear that these azimuth values correspond to a second stationary noise source that is distinct from the first stationary noise source.

In addition to the two stationary noise sources, the classifier example 600 includes a sound source having a dynamic location (e.g., moving talker). For example, the dynamic sound source begins at a first location corresponding to a first azimuth value (e.g., 50 degrees), crosses in front of the device 110 at a second location (e.g., azimuth value wraps around from 0 degrees to 360 degrees), and then continues walking back to the first location. As illustrated in FIG. 6, the path of the dynamic sound source is tracked throughout the room, with the dynamic sound source associated with a sound source identifier except when the moving talker walks in front of the second stationary noise source. While the classifier example 600 illustrates that the dynamic sound source is overwhelmed by the second stationary noise source and therefore is not associated with a sound source identifier near the second stationary noise source, the device 110 may be configured to predict the location of the dynamic sound source based on the previous azimuth values associated with the dynamic sound source. For example, the device 110 may be able to predict that the dynamic sound source is within the second range even when the dynamic sound source is not identified as a candidate sound source.

While the classifier example 500 and the classifier example 600 associates a single sound source with multiple sound source identifiers at different times, this does not impact the accuracy of the look direction selected by the identifier component 350. For example, as the identifier component 350 may select between multiple sound source identifiers detected at a single time, the total number of sound source identifiers does not impact the decision made by the identifier component 350. As described above, the identifier component 350 may determine the target direction data 352 based on the sound source data 342 (e.g., plurality of azimuth values) and the attribute data 344. For example, the identifier component 350 may analyze the attribute data 344 to determine that the first sound source identifier and the second sound source identifier correspond to stationary noise sources that can be ignored. Additionally or alternatively, the identifier component 350 may determine that the third sound source identifier corresponds to a dynamic sound source associated with speech and may select the third sound source identifier as the target sound source to generate the target direction data 352.

Figure 7:
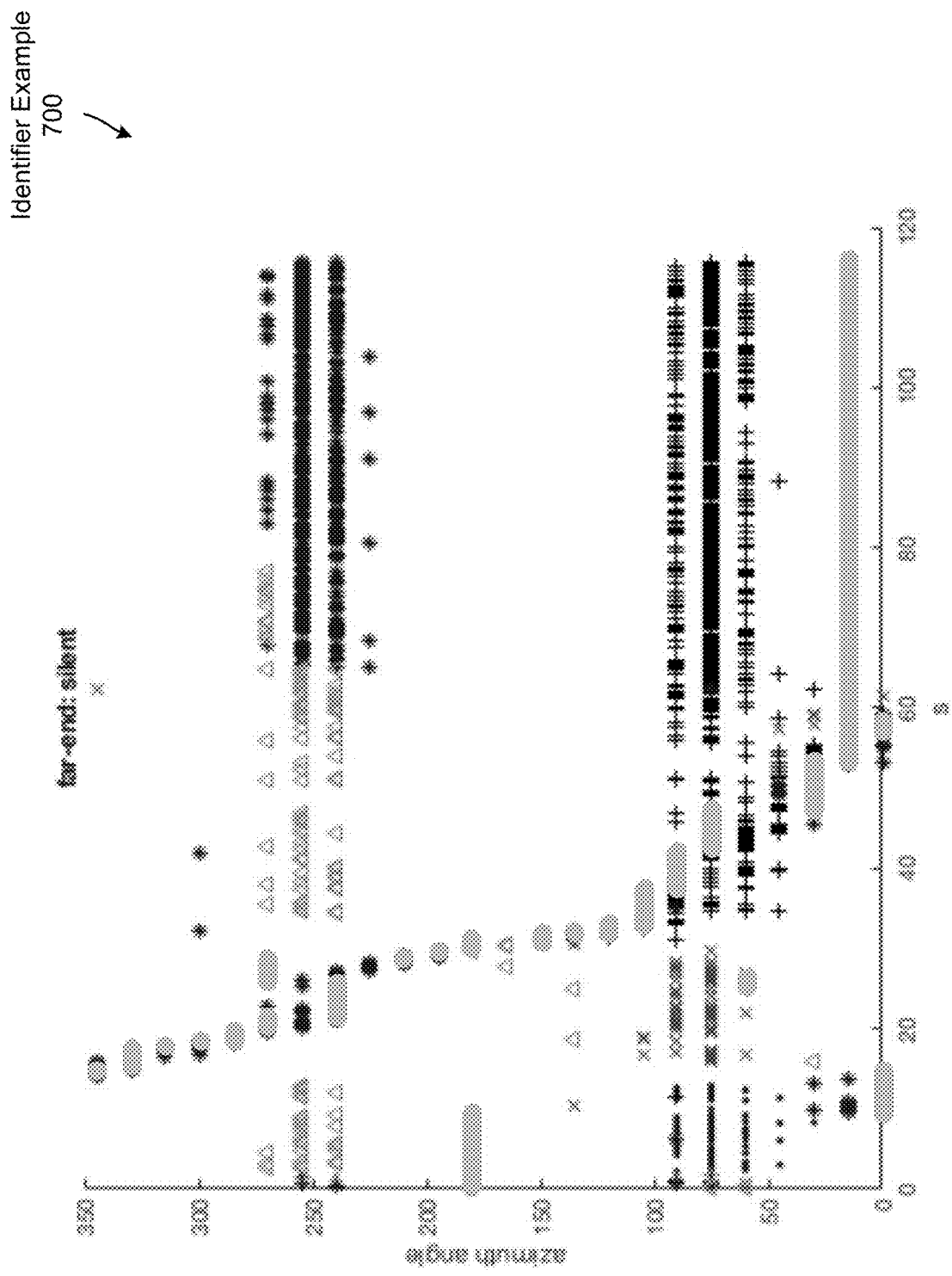
FIG. 7 illustrates an example of selecting a target sound source according to examples of the present disclosure.

FIG. 7 illustrates an example of selecting a target sound source according to examples of the present disclosure. As illustrated in FIG. 7, sound source data 342 and/or attribute data 344 corresponding to the classifier example 500 may be output to the identifier component 350 and the identifier component 350 may generate the target direction data 352. For example, identifier example 700 shown in FIG. 7 illustrates that the identifier component 350 accurately selects a sound source identifier associated with the dynamic sound source as the target look direction while the moving talker walks around the device 110. Thus, the identifier component 350 ignores the first stationary noise source and the second stationary noise source except when the dynamic sound source walks in front of them.

While the output azimuth value corresponding to the look direction (e.g., target direction data 352) may vary at times, such as when the dynamic sound source walks in front of the first stationary noise source, the beamformer component 360 may still capture the desired speech due to a wide beam pattern associated with the beamformer component 360. For example, the beam pattern may correspond to a look direction having an angle of 30 degrees, such that the beamformer component 360 captures audio within 15 degrees on either side of the look direction.

Figure 8:
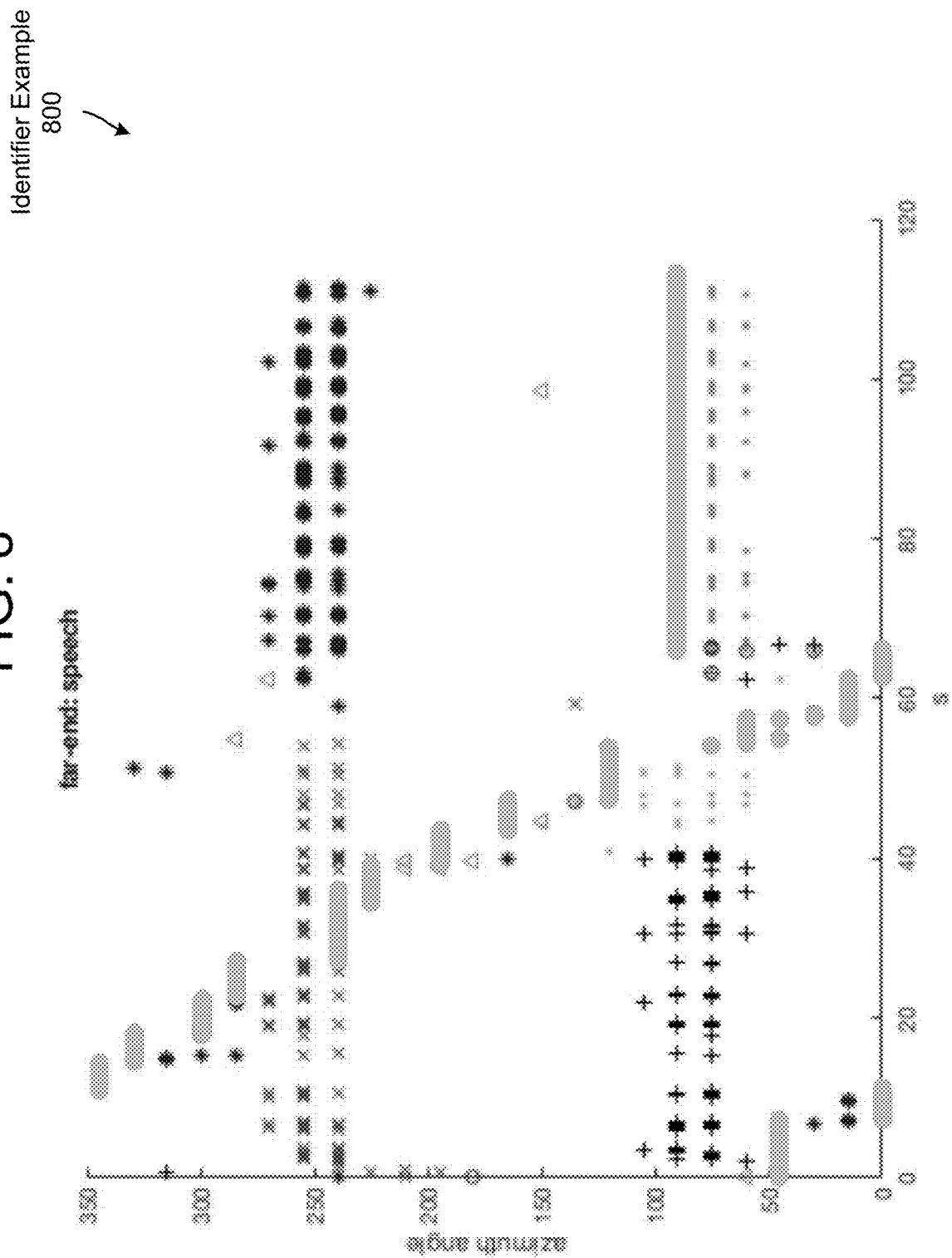
FIG. 8 illustrates an example of selecting a target sound source when far-end voice activity is detected according to examples of the present disclosure.

FIG. 8 illustrates an example of selecting a target sound source when far-end voice activity is detected according to examples of the present disclosure. As illustrated in FIG. 8, sound source data 342 and/or attribute data 344 corresponding to the classifier example 600 may be output to the identifier component 350 and the identifier component 350 may generate the target direction data 352. For example, identifier example 800 shown in FIG. 7 illustrates that the identifier component 350 accurately selects the sound source identifier associated with the dynamic sound source as the target look direction while the moving talker walks around the device 110. Thus, the identifier component 350 ignores the first stationary noise source and the second stationary noise source except when the dynamic sound source walks in front of them for a first portion of the identifier example 800 (e.g., 0-65 seconds). However, during a second portion of the identifier example 800 (e.g., 65-120 seconds), the dynamic sound source is inactive (e.g., moving talker stops speaking) and the identifier component 350 selects the second stationary noise source as the target look direction.

Figure 9:
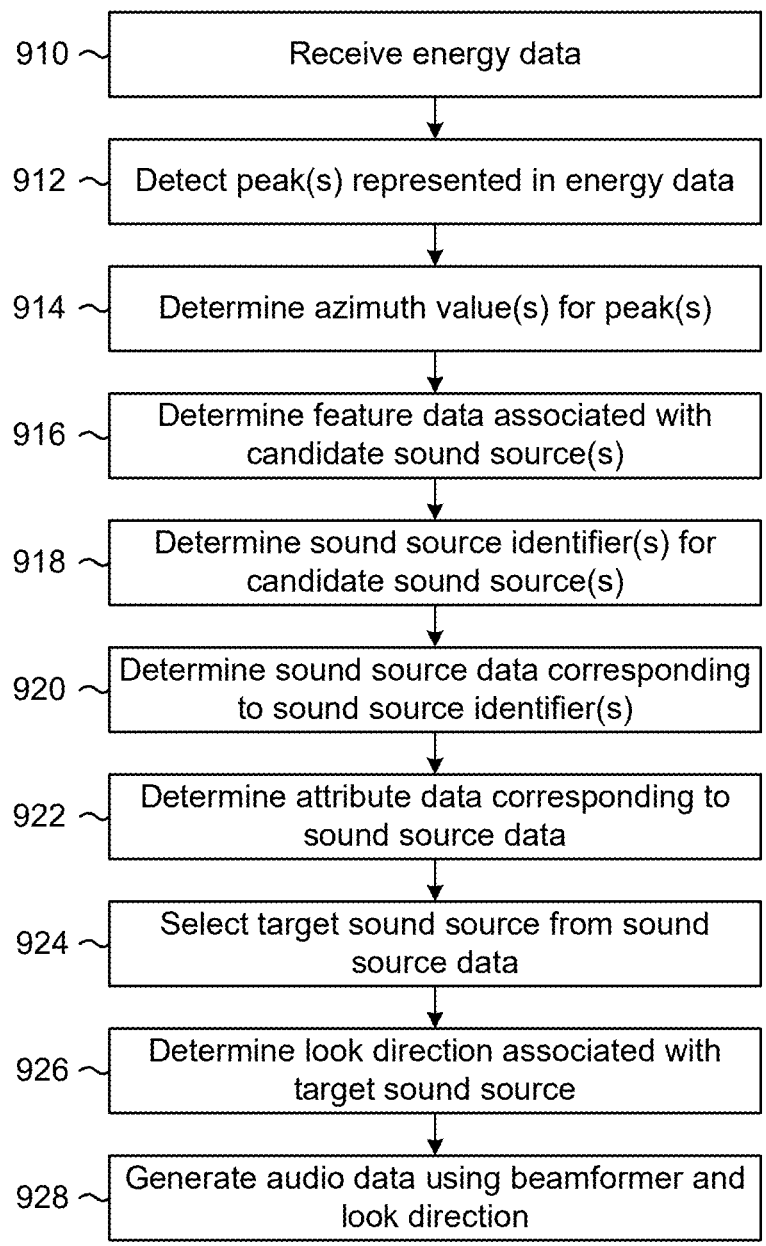
FIG. 9 is a flowchart conceptually illustrating an example method for performing sound source classification and beamforming according to examples of the present disclosure.

FIG. 9 is a flowchart conceptually illustrating an example method for performing sound source classification and beamforming according to examples of the present disclosure. As illustrated in FIG. 9, the device 110 may receive (910) energy data, may detect (912) peak(s) represented in the energy data, and may determine (914) azimuth value(s) corresponding to the peak(s). For example, the device 110 may detect one or more peaks and their corresponding azimuth values, as described in greater detail above with regard to FIG. 4.

The device 110 may determine (916) feature data associated with candidate sound source(s) and may use the feature data to determine (918) sound source identifier(s)

corresponding to the candidate sound source(s). In some examples, the device 110 may determine the features described above with regard to FIG. 3A and may use the features to identify a sound source identifier corresponding to each candidate sound source. For example, the device 110 may determine first features associated with a first candidate sound source, determine that the first features are similar to third attribute data associated with a third sound source identifier (e.g., dehumidifier), and match the first candidate sound source to the third sound source identifier (e.g., associate a first azimuth value and first features with the third sound source identifier). Similarly, the device 110 may determine second features associated with a second candidate sound source, determine that the second features are similar to first attribute data associated with a first sound source identifier (e.g., talker), and match the second candidate sound source to the first sound source identifier (e.g., associate a second azimuth value and second features with the first sound source identifier).

After classifying each of the candidate sound sources to an appropriate sound source identifier, the device 110 may determine (920) sound source data corresponding to the sound source identifiers. For example, the sound source data may include a plurality of azimuth values corresponding to each of the sound source identifiers, although the disclosure is not limited thereto. In addition, the device 110 may determine (922) attribute data corresponding to the sound source data. For example, the device 110 may generate and/or update the attribute data 344 associated with the sound source data. In some examples, this step involves updating existing attribute data, such as updating the third attribute data to include the first azimuth value and the first features and/or determining new attributes or characteristics based on the updated information. However, if the classifier component 340 determines that a candidate sound source does not match an existing sound source (e.g., features are not similar to current attribute data associated with any of the sound sources being tracked), the device 110 may generate new attribute data using the azimuth value and features without departing from the disclosure.

Based on the attribute data, the device 110 may then select (924) a target sound source from the sound source data, may determine (926) a look direction associated with the target sound source, and may generate (928) audio data using the beamformer component 360 and the look direction. For example, the device 110 may determine that the first attribute data associated with the first sound source identifier corresponds to speech and may select the first sound source identifier as the target sound source, although the disclosure is not limited thereto.

Figure 10:
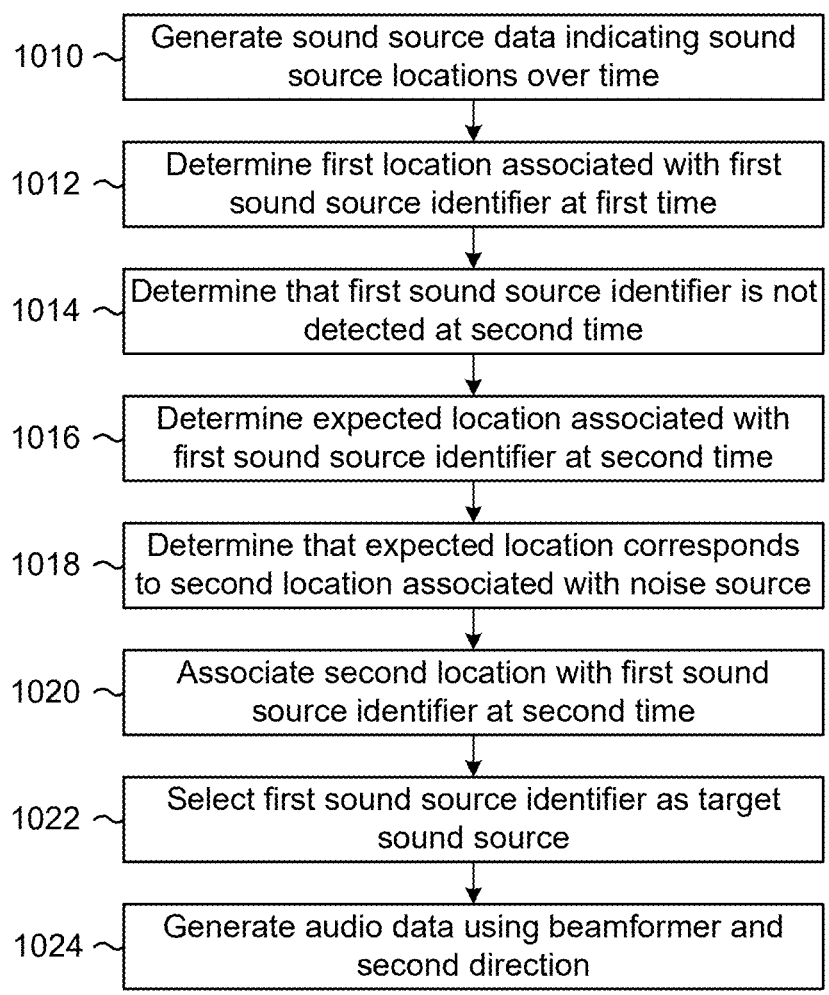
FIG. 10 is a flowchart conceptually illustrating an example method for predicting a location of a user and selecting a corresponding direction according to examples of the present disclosure.

FIG. 10 is a flowchart conceptually illustrating an example method for predicting a location of a user and selecting a corresponding direction according to examples of the present disclosure. As illustrated in FIG. 10, the device 110 may generate (1010) sound source data indicating sound source locations over time, may determine (1012) a first location associated with first sound source identifier at a first time, and may determine (1014) that the first sound source identifier is not detected at a second time. For example, the device 110 may select a dynamic sound source (e.g., moving talker) and track the dynamic sound source as it moves, until the dynamic sound source is no longer detected.

The device 110 may determine (1016) an expected location associated with the first sound source identifier at the second time and may determine (1018) that the expected location corresponds to a second location associated with a stationary noise source (e.g., second sound source identifier). For example, the device 110 may determine that the dynamic sound source moved in line with the stationary noise source and is therefore not detected as a separate candidate sound source. The device 110 may then associate (1020) the second location with the first sound source identifier at the second time, select (1022) the first sound source identifier as a target sound source, and generate (1024) audio data using the beamformer component 360 and the second direction.

Figure 11:
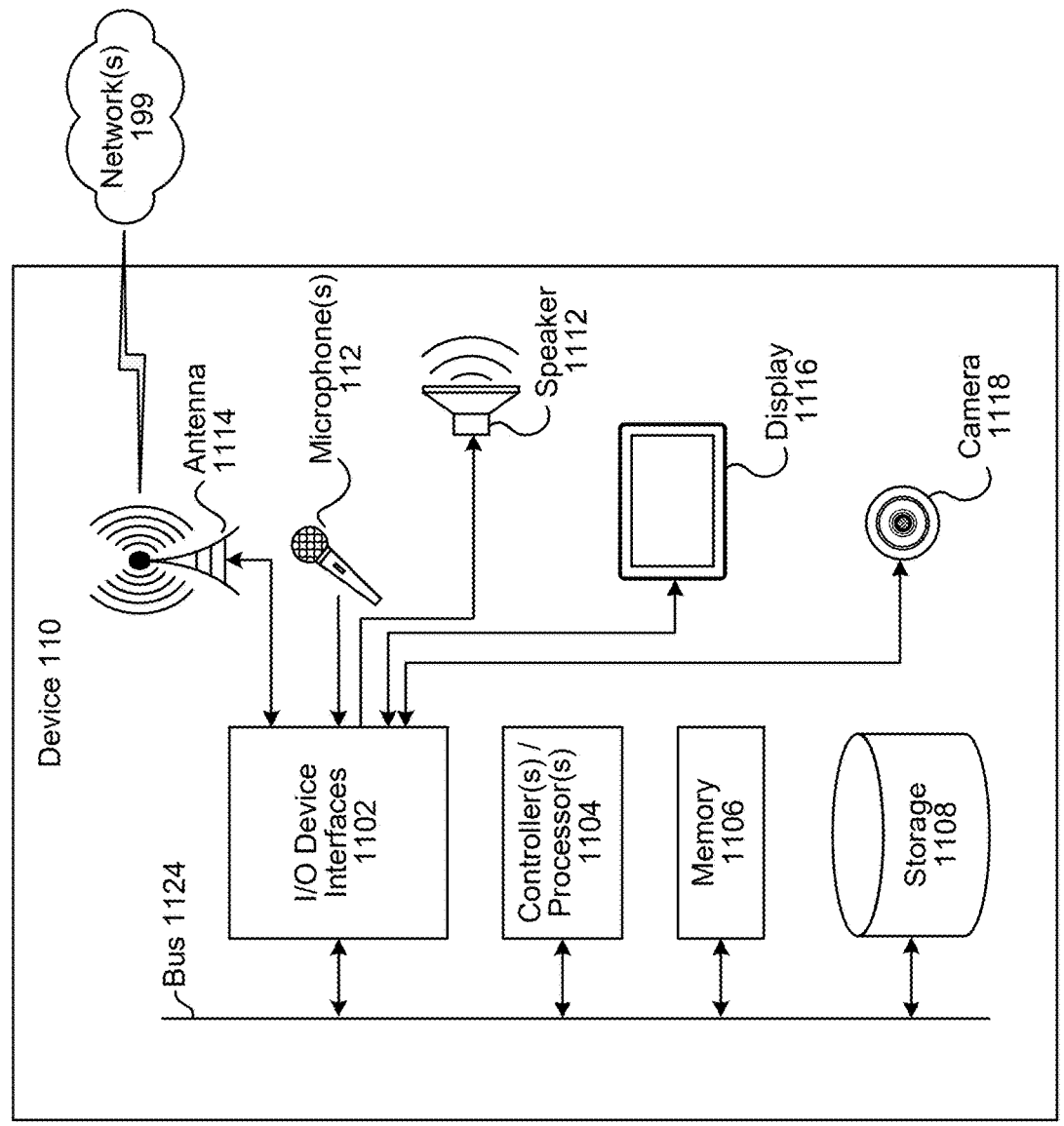
FIG. 11 is a block diagram conceptually illustrating example components of a device, according to embodiments of the present disclosure.

FIG. 11 is a block diagram conceptually illustrating a device 110 that may be used with the system. FIG. 12 is a block diagram conceptually illustrating example components of system(s) 120, such as the natural language command processing system, which may assist with ASR processing, NLU processing, etc., and a skill system 125. A system (120/125) may include one or more servers. A "server" as used herein may refer to a traditional server as understood in a server/client computing structure but may also refer to a number of different computing components that may assist with the operations discussed herein. For example, a server may include one or more physical computing components (such as a rack server) that are connected to other devices/components either physically and/or over a network and is capable of performing computing operations. A server may also include one or more virtual machines that emulates a computer system and is run on one or across multiple devices. A server may also include other combinations of hardware, software, firmware, or the like to perform operations discussed herein. The server(s) may be configured to operate using one or more of a client-server model, a computer bureau model, grid computing techniques, fog computing techniques, mainframe techniques, utility computing techniques, a peer-to-peer model, sandbox techniques, or other computing techniques.

While the device 110 may operate locally to a user (e.g., within a same environment so the device may receive inputs and playback outputs for the user) the server/system 120 may be located remotely from the device 110 as its operations may not require proximity to the user. The server/system 120 may be located in an entirely different location from the device 110 (for example, as part of a cloud computing system or the like) or may be located in a same environment as the device 110 but physically separated therefrom (for example a home server or similar device that resides in a user's home or business but perhaps in a closet, basement, attic, or the like). One benefit to the server/system 120 being in a user's home/business is that data used to process a command/return a response may be kept within the user's home, thus reducing potential privacy concerns.

Multiple systems (120/125) may be included in the overall system 100 of the present disclosure, such as one or more natural language processing systems 120 for performing ASR processing, one or more natural language processing systems 120 for performing NLU processing, one or more skill systems 125, etc. In operation, each of these systems may include computer-readable and computer-executable instructions that reside on the respective device (120/125), as will be discussed further below.

Each of these devices (110/120/125) may include one or more controllers/processors (1104/1204), which may each include a central processing unit (CPU) for processing data and computer-readable instructions, and a memory (1106/1206) for storing data and instructions of the respective device. The memories (1106/1206) may individually include volatile random access memory (RAM), non-volatile read only memory (ROM), non-volatile magnetoresistive memory (MRAM), and/or other types of memory. Each device (110/120/125) may also include a data storage component (1108/1208) for storing data and controller/processor-executable instructions. Each data storage component (1108/1208) may individually include one or more non-volatile storage types such as magnetic storage, optical storage, solid-state storage, etc. Each device (110/120/125) may also be connected to removable or external non-volatile memory and/or storage (such as a removable memory card, memory key drive, networked storage, etc.) through respective input/output device interfaces (1102/1202).

Computer instructions for operating each device (110/120/125) and its various components may be executed by the respective device's controller(s)/processor(s) (1104/1204), using the memory (1106/1206) as temporary "working" storage at runtime. A device's computer instructions may be stored in a non-transitory manner in non-volatile memory (1106/1206), storage (1108/1208), or an external device(s). Alternatively, some or all of the executable instructions may be embedded in hardware or firmware on the respective device in addition to or instead of software.

Each device (110/120/125) includes input/output device interfaces (1102/1202). A variety of components may be connected through the input/output device interfaces (1102/1202), as will be discussed further below. Additionally, each device (110/120/125) may include an address/data bus (1124/1224) for conveying data among components of the respective device. Each component within a device (110/120/125) may also be directly connected to other components in addition to (or instead of) being connected to other components across the bus (1124/1224).

Referring to FIG. 11, the device 110 may include input/output device interfaces 1102 that connect to a variety of components such as an audio output component such as one or more loudspeaker(s) 1112, a wired headset or a wireless headset (not illustrated), or other component capable of outputting audio. The device 110 may also include an audio capture component. The audio capture component may be, for example, one or more microphone(s) 1120 or array of microphones, a wired headset or a wireless headset (not illustrated), etc. If an array of microphones is included, approximate distance to a sound's point of origin may be determined by acoustic localization based on time and amplitude differences between sounds captured by different microphones of the array. The device 110 may additionally include a display 1116 for displaying content. The device 110 may further include a camera 1118.

Via antenna(s) 1122, the input/output device interfaces 1102 may connect to one or more networks 199 via a wireless local area network (WLAN) (such as Wi-Fi) radio, Bluetooth, and/or wireless network radio, such as a radio capable of communication with a wireless communication network such as a Long Term Evolution (LTE) network, WiMAX network, 3G network, 4G network, 5G network, etc. A wired connection such as Ethernet may also be supported. Through the network(s) 199, the system may be distributed across a networked environment. The I/O device interface (1102/1202) may also include communication components that allow data to be exchanged between devices such as different physical servers in a collection of servers or other components.

The components of the device(s) 110, the system(s) 120 (e.g., natural language command processing system), or a skill system 125 may include their own dedicated processors, memory, and/or storage. Alternatively, one or more of the components of the device(s) 110, the system(s) 120, or a skill system 125 may utilize the I/O interfaces (1102/1202), processor(s) (1104/1204), memory (1106/1206), and/or storage (1108/1208) of the device(s) 110, the system(s) 120, or the skill system 125, respectively. Thus, an ASR component may have its own I/O interface(s), processor(s), memory, and/or storage; an NLU component may have its own I/O interface(s), processor(s), memory, and/or storage; and so forth for the various components discussed herein.

As noted above, multiple devices may be employed in a single system. In such a multi-device system, each of the devices may include different components for performing different aspects of the system's processing. The multiple devices may include overlapping components. The components of the device 110, the system(s) 120, and a skill system 125, as described herein, are illustrative, and may be located as a stand-alone device or may be included, in whole or in part, as a component of a larger device or system. As can be appreciated, a number of components may exist either on the system(s) 120 and/or on the device 110. Unless expressly noted otherwise, the system version of such components may operate similarly to the device version of such components and thus the description of one version (e.g., the system version or the local version) applies to the description of the other version (e.g., the local version or system version) and vice-versa.

As illustrated in FIG. 13, multiple devices (110a-110e, 120, 125) may contain components of the system and the devices may be connected over a network(s) 199. The network(s) 199 may include a local or private network or may include a wide network such as the Internet. Devices may be connected to the network(s) 199 through either wired or wireless connections. For example, speech-detection device(s) with display 110a, speech-detection device(s) 110b, an input/output limited device 110c, a display/smart television 110d, and/or a motile device 110e may be connected to the network(s) 199 through a wireless service provider, over a Wi-Fi or cellular network connection, or the like. Other devices are included as network-connected support devices, such as the natural language command processing system 120, the skill system(s) 125, and/or others. The support devices may connect to the network(s) 199 through a wired connection or wireless connection. Networked devices may capture audio using one-or-more built-in or connected microphones or other audio capture devices, with processing performed by ASR components, NLU components, or other components of the same device or another device connected via the network(s) 199, such as an ASR component, an NLU component, etc. of a natural language command processing system.

The concepts disclosed herein may be applied within a number of different devices and computer systems, including, for example, general-purpose computing systems, speech processing systems, and distributed computing environments.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers and speech processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein. Further, unless expressly stated to the contrary, features/operations/components, etc.

from one embodiment discussed herein may be combined with features/operations/components, etc. from another embodiment discussed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk, and/or other media. In addition, components of system may be implemented as in firmware or hardware.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method, the method comprising:
    receiving first energy data including a first energy value corresponding to a first direction relative to a first device and a second energy value corresponding to a second direction relative to the first device;
    receiving first direction data indicating that a first candidate sound source is associated with the first direction;
    determining first feature data corresponding to the first candidate sound source;
    determining, using the first feature data, that the first candidate sound source is associated with first data corresponding to a first identifier;
    determining, using second feature data associated with the first data, that the first identifier is associated with first speech input; and
    in response to determining that the first identifier is associated with the first speech input, generating, using a beamformer, first audio data representing the first speech input, the first audio data corresponding to the first direction.

2. The computer-implemented method of claim 1, further comprising:
    receiving second direction data indicating that a second candidate sound source is associated with the second direction;
    determining third feature data corresponding to the second candidate sound source;
    determining, using the third feature data, that the second candidate sound source is associated with second data corresponding to a second identifier;
    determining, using the second data, that the second identifier is associated with the second direction for a first length of time;
    determining that the first length of time exceeds a threshold value; and
    in response to determining that the first length of time exceeds the threshold value, determining that the second identifier is a noise source.

3. The computer-implemented method of claim 1, further comprising:
    receiving, by the first device, second audio data originating from a second device;
    generating, using a portion of the second audio data, output audio;
    determining that second speech is represented in the portion of the second audio data; and
    generating, using the beamformer, third audio data corresponding to the first direction.

4. The computer-implemented method of claim 1, wherein determining that the first candidate sound source is associated with the first data further comprises:
    determining third feature data associated with second data corresponding to a second identifier;
    determining the second feature data associated with the first data;
    determining that the first feature data does not correspond to the third feature data; and
    determining that the first feature data corresponds to the second feature data.

5. The computer-implemented method of claim 1, further comprising:
    determining, using the first data, a spatial variance associated with the first candidate sound source;
    determining, using the first data, a first value indicating a maximum duration of time that the first candidate sound source was detected; and
    determining, using the first data, a second value indicating a maximum number of consecutive audio frames in which the first candidate sound source was detected,
    wherein the second feature data includes the spatial variance, the first value, and the second value.

6. The computer-implemented method of claim 1, further comprising:
    determining, during a first time period after receiving the first direction data, that the first identifier is associated with a second direction;
    determining, using the first direction and the second direction, a third direction; and
    determining prediction data indicating that the first candidate sound source is likely to be in the third direction during a second time period after the first time period.

7. The computer-implemented method of claim 6, further comprising:

determining that the first identifier is not detected during the second time period;

determining that the third direction is associated with a noise source during the second time period; and associating, using the prediction data, the third direction with the first identifier during the second time period.

8. The computer-implemented method of claim 1, further comprising:

determining, during a first time period after receiving the first direction data, that the first identifier is associated with a second direction;

determining, using the first direction and the second direction, a plurality of directions relative to the first device associated with the first identifier and a second time period after the first time period;

receiving, during the second time period, second direction data indicating that a second candidate sound source is associated with a third direction;

determining that the third direction is one of the plurality of directions; and associating the third direction with the first identifier during the second time period.

9. The computer-implemented method of claim 1, further comprising:

determining that the first energy value corresponds to a first peak represented in the first energy data;

determining that the first energy value corresponds to the first direction; and determining, using the first energy data, a variance associated with the first peak, wherein the first direction data indicates the first direction and the variance associated with the first peak.

10. The computer-implemented method of claim 1, further comprising:

receiving second direction data indicating that a second candidate sound source is associated with the second direction;

determining third feature data corresponding to the second candidate sound source;

determining, using the third feature data, that the second candidate sound source is associated with second data corresponding to a second identifier;

determining, using the second data, that the second identifier corresponds to a second device; and associating the second device with the second direction.

11. A system comprising:

at least one processor; and memory including instructions operable to be executed by the at least one processor to cause the system to:

receive first energy data including a first energy value corresponding to a first direction relative to a first device and a second energy value corresponding to a second direction relative to the first device;

receive first direction data indicating that a first candidate sound source is associated with the first direction;

determine first feature data corresponding to the first candidate sound source;

determine, using the first feature data, that the first candidate sound source is associated with first data corresponding to a first identifier;

determine, using second feature data associated with the first data, that the first identifier is associated with first speech input; and in response to determining that the first identifier is associated with the first speech input, generate, using a beamformer, first audio data representing the first speech input, the first audio data corresponding to the first direction.

12. The system of claim 11, wherein the memory further comprises instructions that, when executed by the at least one processor, further cause the system to:

receive second direction data indicating that a second candidate sound source is associated with the second direction;

determine third feature data corresponding to the second candidate sound source;

determine, using the third feature data, that the second candidate sound source is associated with second data corresponding to a second identifier;

determine, using the second data, that the second identifier is associated with the second direction for a first length of time;

determining that the first length of time exceeds a threshold value;

in response to determining that the first length of time exceeds the threshold value, determining that the second identifier corresponds to a noise source; and select the first candidate sound source as a desired sound source corresponding to the first length of time, wherein generating the first audio data using the beamformer is based at least in part on selecting the first candidate sound source as the desired sound source.

13. The system of claim 11, wherein the memory further comprises instructions that, when executed by the at least one processor, further cause the system to:

receive, by the first device, second audio data originating from a second device;

generate, using a portion of the second audio data, output audio;

determine that second speech is represented in the portion of the second audio data; and generate, using the beamformer, third audio data corresponding to the first direction.

14. The system of claim 11, wherein the memory further comprises instructions that, when executed by the at least one processor, further cause the system to:

determine third feature data associated with second data corresponding to a second identifier;

determine the second feature data associated with the first data;

determine that the first feature data does not correspond to the third feature data; and determine that the first feature data corresponds to the second feature data.

15. The system of claim 11, wherein the memory further comprises instructions that, when executed by the at least one processor, further cause the system to:

determine, using the first data, a spatial variance associated with the first candidate sound source;

determine, using the first data, a first value indicating a maximum duration of time that the first candidate sound source was detected; and determine, using the first data, a second value indicating a maximum number of consecutive audio frames in which the first candidate sound source was detected, wherein the second feature data includes the spatial variance, the first value, and the second value.

16. The system of claim 11, wherein the memory further comprises instructions that, when executed by the at least one processor, further cause the system to:

determine, during a first time period after receiving the first direction data, that the first identifier is associated with a second direction;

determine, using the first direction and the second direction, a third direction; and determine prediction data indicating that the first candidate sound source is likely to be in the third direction during a second time period after the first time period.

17. The system of claim 16, wherein the memory further comprises instructions that, when executed by the at least one processor, further cause the system to:

determine that the first identifier is not detected during the second time period;

determine that the third direction is associated with a noise source during the second time period; and associating, using the prediction data, the third direction with the first identifier during the second time period.

18. The system of claim 11, wherein the memory further comprises instructions that, when executed by the at least one processor, further cause the system to:

determine, during a first time period after receiving the first direction data, that the first identifier is associated with a second direction;

determine, using the first direction and the second direction, a plurality of directions relative to the first device associated with the first identifier and a second time period after the first time period;

receive, during the second time period, second direction data indicating that a second candidate sound source is associated with a third direction;

determine that the third direction is one of the plurality of directions; and associate the third direction with the first identifier during the second time period.

19. The system of claim 11, wherein the memory further comprises instructions that, when executed by the at least one processor, further cause the system to:

determine that the first energy value corresponds to a first peak represented in the first energy data;

determine that the first energy value corresponds to the first direction; and determine, using the first energy data, a variance associated with the first peak, wherein the first direction data indicates the first direction and the variance associated with the first peak.

20. The system of claim 11, wherein the memory further comprises instructions that, when executed by the at least one processor, further cause the system to:

receive second direction data indicating that a second candidate sound source is associated with the second direction;

determine third feature data corresponding to the second candidate sound source;

determine, using the third feature data, that the second candidate sound source is associated with second data corresponding to a second identifier;

determine, using the second data, that the second identifier corresponds to a second device; and associate the second device with the second direction.

21. The computer-implemented method of claim 1, further comprising:

generating, using the beamformer, the first energy data.

22. The computer-implemented method of claim 1, wherein generating the first audio data further comprises:

in response to determining that the first identifier is associated with the first speech input, generating target direction data indicating the first direction associated with the first candidate sound source; and generating, using the beamformer and the target direction data, the first audio data representing the first speech input.

* * * * *